(12) United States Patent
Eisley et al.

(10) Patent No.: US 11,743,664 B2
(45) Date of Patent: *Aug. 29, 2023

(54) SOUND MANAGEMENT METHOD AND SYSTEM

(71) Applicant: QSIC PTY LTD, Abbotsford (AU)

(72) Inventors: Matthew Eisley, Abbotsford (AU); Gerard Smith, Abbotsford (AU); Nick Larkins, Abbotsford (AU)

(73) Assignee: QSIC PTY LTD, Abbotsford (AU)

(*) Notice: Subject to any disclaimer, the term of this patent is extended or adjusted under 35 U.S.C. 154(b) by 0 days.

This patent is subject to a terminal disclaimer.

(21) Appl. No.: 17/807,682

(22) Filed: Jun. 17, 2022

(65) Prior Publication Data

US 2022/0386051 A1    Dec. 1, 2022

Related U.S. Application Data

(63) Continuation of application No. 16/468,155, filed as application No. PCT/AU2017/051378 on Dec. 13, 2017, now Pat. No. 11,388,533.

(30) Foreign Application Priority Data

Dec. 13, 2016 (AU) ................ 2016905143

(51) Int. Cl.
*H03G 3/32* (2006.01)
*H04R 29/00* (2006.01)
(Continued)

(52) U.S. Cl.
CPC ............ *H04R 29/00* (2013.01); *H04R 3/12* (2013.01); *H04R 27/00* (2013.01)

(58) Field of Classification Search
CPC ... H03G 3/20; H03G 3/32; H03G 3/24; H04R 29/00; H04R 3/12; H04R 27/00; H04R 29/005; H04R 29/007; H04R 2430/01
(Continued)

(56) References Cited

U.S. PATENT DOCUMENTS 5,666,426 A    9/1997 Helms
6,389,139 B1    5/2002 Curtis et al.
(Continued)

FOREIGN PATENT DOCUMENTS

AU    199655307 B    10/1996
EP    1067682 A2    10/2001
(Continued)

OTHER PUBLICATIONS

Office Action dated Aug. 31, 2022, in corresponding Japanese Patent Application No. 2019-529178.
(Continued)

*Primary Examiner* — Disler Paul

(74) *Attorney, Agent, or Firm* — Knobbe Martens Olson & Bear, LLP

(57) ABSTRACT

A computer implemented method for managing a sound emitting device comprising: receiving data associated with operation of the sound emitting device at a predetermined location; processing said data to determine an operating characteristic of that device for that location; comparing the operating characteristic with a predetermined mathematical relationship to determine whether a difference exists; and identifying an input adjustment to correct the difference wherein the input adjustment optionally is within a predetermined range and optionally does not exceed a predetermined maximum increment; wherein the predetermined mathematical relationship is between an input variable and an output variable in respect of the sound emitting device.

20 Claims, 17 Drawing Sheets

(51) Int. Cl.
*H04R 3/12* (2006.01)
*H04R 27/00* (2006.01)

(58) Field of Classification Search
USPC .................................. 381/104, 107, 56–57
See application file for complete search history.

(56) References Cited

U.S. PATENT DOCUMENTS

| | | | |
|---|---|---|---|
| 6,520,282 | B1 | 2/2003 | Hadzic et al. |
| 6,584,201 | B1 | 6/2003 | Konstantinou et al. |
| 7,110,558 | B1 | 9/2006 | Elliot |
| 7,210,633 | B2 | 5/2007 | Broere |
| 7,853,341 | B2 | 12/2010 | McCarty et al. |
| 9,264,836 | B2 * | 2/2016 | Katsianos .............. H03G 9/005 |
| 9,462,381 | B2 | 10/2016 | Krishnaswamy et al. |
| 9,685,921 | B2 * | 6/2017 | Smith .................... H03G 3/20 |
| 9,966,916 | B2 * | 5/2018 | Seefeldt .................. H03G 9/24 |
| 2007/0038457 | A1 | 2/2007 | Hwang et al. |
| 2009/0123004 | A1 | 5/2009 | Otto et al. |
| 2011/0002471 | A1 | 1/2011 | Wihardja et al. |
| 2011/0305346 | A1 * | 12/2011 | Daubigny ................ H03G 3/02 381/28 |
| 2012/0135684 | A1 | 3/2012 | Shrum, Jr. et al. |
| 2013/0028443 | A1 | 1/2013 | Pance et al. |
| 2014/0334644 | A1 | 11/2014 | Sellig et al. |
| 2015/0010169 | A1 | 1/2015 | Popova |
| 2015/0281864 | A1 | 10/2015 | Song et al. |
| 2016/0154881 | A1 | 1/2016 | Jitkoff et al. |
| 2016/0149547 | A1 | 3/2016 | Rider et al. |
| 2016/0309277 | A1 | 10/2016 | Hiscock |
| 2018/0253276 | A1 | 9/2018 | Kodama |

FOREIGN PATENT DOCUMENTS

| | | |
|---|---|---|
| EP | 1351543 A3 | 4/2007 |
| EP | 1251355 B1 | 5/2007 |
| EP | 2058945 B1 | 12/2011 |
| JP | H10170928 | 6/1998 |
| JP | 2009244765 A | 10/2009 |
| JP | 2011198661 | 10/2011 |
| WO | WO 9917442 | 4/1999 |
| WO | WO 0059110 | 10/2000 |
| WO | WO 2007135679 A2 | 11/2007 |
| WO | WO 2007140024 A3 | 12/2007 |
| WO | WO 2008134689 A1 | 11/2008 |
| WO | WO 2016079513 A1 | 5/2016 |

OTHER PUBLICATIONS

Extended European Search Report dated Feb. 26, 2020 for corresponding PCT application No. PCT/AU2017/051378.

* cited by examiner

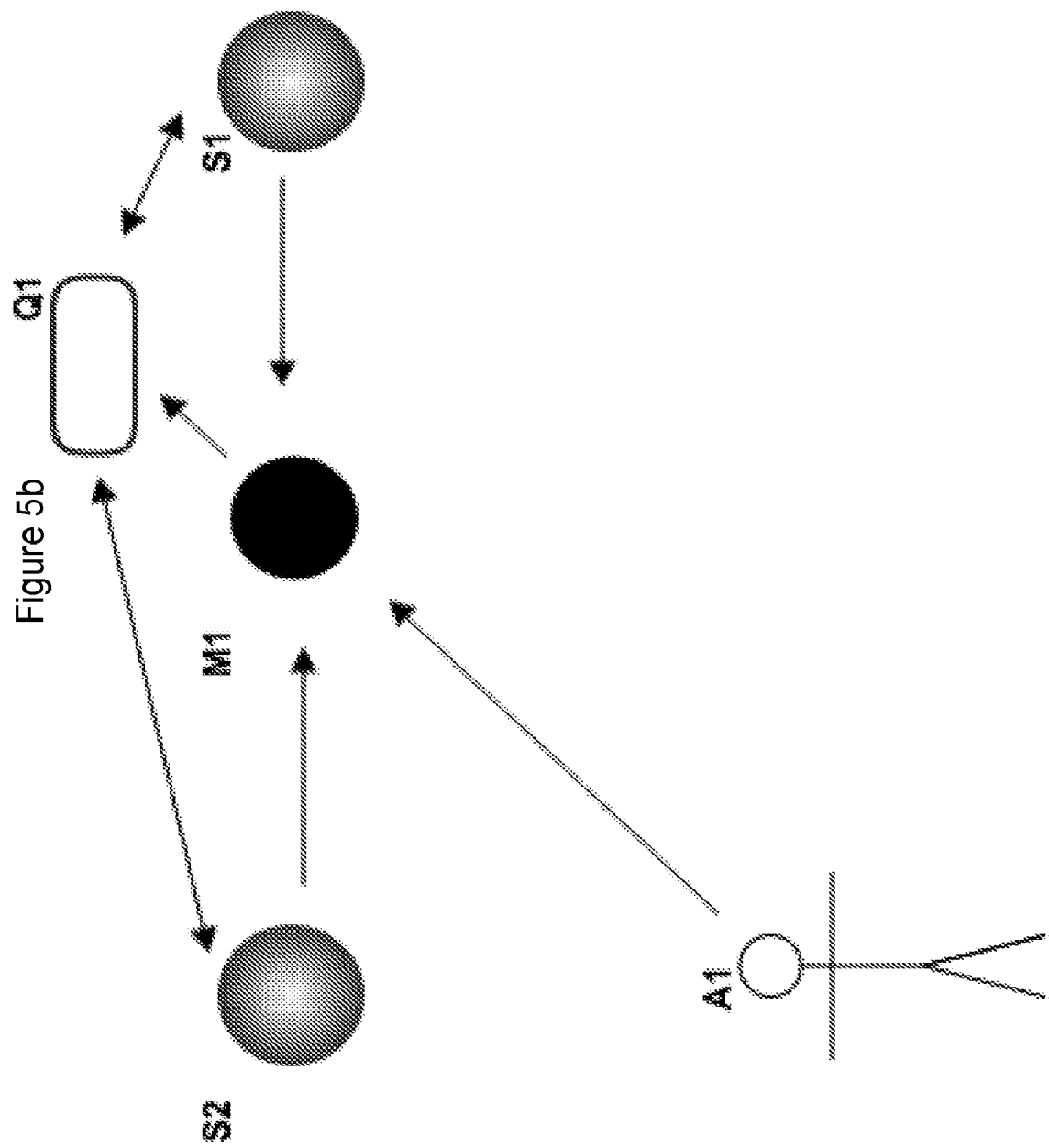

SOUND MANAGEMENT METHOD AND SYSTEM

CROSS-REFERENCE TO RELATED APPLICATIONS

This application is a continuation of U.S. patent application Ser. No. 16/468,155, filed Jun. 10, 2019, pending, which is the U.S. National Stage under 35 U.S.C. § 371 of PCT App. No. PCT/AU2017/051378, filed on Dec. 13, 2017, which in turn claims priority to Australian Application No. AU2016905143, filed Dec. 13, 2016, each of the foregoing of which are hereby incorporated by reference in their entireties.

BACKGROUND OF THE INVENTION

Many commercial sectors use sound equipment for example to play music throughout a space occupied by customers—for example a shop floor, a restaurant or a bar. The retail and hospitality sectors have long suffered from incorrect sound volume levels throughout trading periods. A major cause of this is that a large number of customers can come and go very quickly so that the number of people in a given space and the associated level of background noise can vary considerably. When this happens, staff need to recognise the change in conditions and adjust the sound volume accordingly. As staff are focused on servicing customers, this means that the volume is regularly set either too high or too low. Both scenarios are terrible for customer experience and can impact various parts of the sales process or dining experience.

A major disadvantage felt by these markets, is that optimum performance of an audio solution requires high levels of staff monitoring and interaction, which is rarely possible or practical. Therefore, audio solutions in general deliver poor results when left to their own devices.

The reference to any prior art in this specification is not, and should not be taken as, an acknowledgement or any form of suggestion that the prior art forms part of the common general knowledge.

SUMMARY OF THE INVENTION

The system and method of the invention, also referred to herein as 'Autonomous Volume Adjustment', or 'AVA' has been developed to ameliorate the problems of the prior art. AVA is an always on, autonomous algorithm which monitors noise levels inside a given area and makes multiple adjustments or sends notifications to speakers, IoT devices, digital services, APIs and other connected devices. AVA matches the listening conditions in store/venue with the appropriate playback settings (volume, treble, bass, frequency and other settings/filters) in near real time. AVA also assists in making content selection adjustments and may send/receive other notifications based on audio input device (such as a microphone) measurements which it has linked to in store behaviours/patterns over time.

Accordingly in one aspect of the invention, there is provided a computer implemented method for managing a sound emitting device comprising: receiving data associated with operation of the sound emitting device at a predetermined location; processing said data to determine an operating characteristic of that device for that location; comparing the operating characteristic with a predetermined mathematical relationship to determine whether a difference exists; and identifying an input adjustment to correct the difference wherein the input adjustment optionally is within a predetermined range and optionally does not exceed a predetermined maximum increment; wherein the predetermined mathematical relationship is between an input variable and an output variable in respect of the sound emitting device.

In some embodiments of this aspect, there is a further step of receiving data associated with operation of the sound capturing device at a predetermined location. Operation of the sound emitting device may be in any suitable location and time, and in some embodiments, operation of the sound emitting device is at a predetermined location and time.

The input variable may be of any suitable form, and is optionally a power value or a loudness value which may comprise one or more of a peak value, an RMS value and/or an averaged loudness value. In some embodiments the input variable is at least partially arrived at by determining a Sound Pressure Level (SPL) for example at an audio input device.

The output value may be of any suitable form and is preferably for example a sound volume. Sound volume may be measured in any suitable way and is optionally measured at a predetermined distance from the speaker. In some embodiments, the mathematical relationship is determined at the same predetermined location.

Transfer of data may be by any suitable means, optionally it is received via a physical connection and/or received wirelessly, and optionally by one or more of WiFi, Bluetooth, ZigBee and LiFi. The data itself may be of any suitable type, for example it may comprise one or more of voltage, current, power, electrical frequency, electrical amplitude, sound pressure, sound frequency, sound amplitude, and sound volume.

The operating characteristic according to the invention may be of any suitable form, for example it may comprise one or more of an input variable or an output variable in respect of the sound emitting device. The input variable may be of any suitable type, for example optionally it may be a power value or a loudness value which may for example comprise one or more of a peak value, an RMS value and/or an averaged loudness value. The output variable according to the invention may be of any suitable type, and for example it may be a sound volume.

In those embodiments which comprise use of an RMS value, it may be determined by any suitable method, for example the RMS value may be determined by the following formula or a variant:

$$p(x)=p[0]*x^{**}\text{deg}+ \ldots +p[\text{deg}] \text{ of degree deg to points } (x,y).$$

The processing step may comprise any suitable sub-steps, for example, in some embodiments, it comprises determining a first operating characteristic of that device for that location and determining a second operating characteristic of that device for that location.

The comparing step may comprise any suitable sub-steps, in some embodiments, it comprises one or more of: searching a lookup table to identify a value equivalent to the first operating characteristic for the location, identifying from the table a correlated second operating characteristic and comparing the correlated second characteristic with the second operating characteristic for the location to determine a difference between them; and/or calculating a correlated second operating characteristic from the first operating characteristic using the predetermined mathematical relationship and comparing the correlated second characteristic with the second operating characteristic for the location to determine a difference between them; and/or searching a Machine Learning or Artificial Intelligence model to identify a value equivalent to the first operating characteristic for the location, identifying from the model a correlated second operating characteristic and comparing the correlated second characteristic with the second operating characteristic for the location to determine a difference between them; and/or searching a historical data model to identify a value equivalent to the first operating characteristic for the location, identifying from the model a correlated second operating characteristic and comparing the correlated second characteristic with the second operating characteristic for the location to determine a difference between them.

The input adjustment may be communicated in any suitable way, for example in some preferred embodiments it is communicated as an instruction to the sound emitting device. In some embodiments, the input adjustment is identified by a method comprising one or more of: searching a lookup table to identify a value equivalent to the difference between the operating characteristic and the predetermined mathematical relationship and identifying from the table a correlated input adjustment; and/or calculating a correlated input adjustment from the value of the difference between the operating characteristic and a value returned from the predetermined mathematical relationship; and/or calculating using a predetermined configuration for the operating range of a speaker whose input cannot exceed the operating range and is a correlated input adjustment from the value of the difference between the operating characteristic and the value returned from the predetermined mathematical relationship; and/or calculating a correlated input adjustment using recorded historical data to identify similar conditions.

The predetermined mathematical relationship can be determined in any suitable way, in some preferred embodiments it is determined by a method comprising one or more of: generating a curve of best fit based on a set of inputs and outputs in respect of the sound emitting device; and/or algorithmically creating an equation to describe the relationship between a set of inputs and output in respect of the sound emitting device.

The input variable may be of any suitable type, for example in some preferred embodiments it is a power value or a loudness value.

In some preferred embodiments, one or more components of the system of the invention may be connected to a network which may for example be physical or wireless or the like. In some preferred embodiments, one or more of the audio input device, the sound emitting device, the processor, or another system component is connected to a network which is optionally the internet.

The operating characteristics and operating variable which are managed may be of any suitable type which can be used to optimise the audio environment within a space, for example they may comprise one or more of volume, treble, bass, balance, audio content, perceived loudness, sound morphing, speech clarity. Similarly, the correlated input adjustment used to manage the sound environment may be of any suitable type, for example it may comprise an input adjustment relating to one or more of volume, treble, bass, balance, audio content, perceived loudness, sound morphing, speech clarity.

In some preferred embodiments, the correlated input adjustment relates to audio content and embodiments it comprises instructions in relation to adjusting audio content being played or to be played by the sound emitting device. The adjustment made according to the method of the invention may be of any suitable type suitable to improve or adjust an audio environment in a space, and may for example comprise one or more of: normalising a sound file, adjusting a sound parameter (which are optionally one or more of volume, bass, treble), playing advertising or marketing content, playing appropriate content, content adjustment, triggering in-store promotions, notifying in real time other digital services about upcoming changes in the in-store/venue environment and sentiment analysis. It will be appreciated that the adjustment may occur at any suitable time, and for example it may occur optionally: as the content is loaded into the system or at a set time before it is scheduled to be played. In some embodiments, adjustment is undertaken based on one or more characteristics of the predetermined location. In those embodiments which comprise a normalising step it preferably comprises adjusting gain so that an item of audio content will play at a similar level to other content being played or to be played.

In another aspect of the invention there is provided a method of managing a sound emitting device comprising: detecting ambient sound at a microphone; converting the sound to a digital signal; recording the digital signal for a period which is optionally 5 to 60 seconds; storing data associated with the recorded time segment of digital signal in a data store; analysing the stored data to determine one or more features thereof; comparing the determined features to features determined from a previous set of stored data to identify a difference; identifying an input adjustment correlated with the identified difference; and communicating the input adjustment to the sound emitting device. In some preferred embodiments there is a further step comprising determining an average frequency of sound during the period and some such embodiments comprise the step of adjusting audio content optionally by replacing the queued tracks with targeted and optionally demographic based content, in response to an overall increase or decrease in average pitch and or frequency of the sound during the period wherein the replacement is optionally gender based, and/or age based.

In another aspect of the invention there is provided a method of managing a sound emitting device comprising the steps of: detecting sound at a microphone wherein the sound comprises one or more of: sound from the sound emitting device; sound from one or more other sound emitting devices and other sound such as ambient sound; converting the sound to a digital signal which optionally comprises identity data to associate the signal with the sound emitting device; communicating the digital signal to a computing device; identifying the digital signal as relevant to operation of the sound emitting device; analysing the digital signal to identify an output corresponding to an adjustment in the operation of the sound emitting device; communicating the output to the sound emitting device.

In another aspect of the invention, there is provided a method of managing an audio device comprising the steps of: detecting an audio device which comprises one or more of an audio input device which is optionally a microphone or a sound emitting device; analysing data associated with the audio device to identify it; searching a data store for configuration data associated with the identified audio device; retrieving configuration data in relation to the identified audio device from the data store. Some embodiments of this aspect of the invention, comprise the steps of: detecting an audio input device which is optionally a microphone; analysing data associated with the audio input device to identify it; searching a data store for configuration data associated with the identified audio input device; retrieving configuration data in relation to the identified audio input device from the data store; detecting a sound emitting device; analysing data associated with the sound emitting to identify it; searching a data store for configuration data associated with the identified sound emitting; retrieving configuration data in relation to the identified sound emitting device from the data store.

The audio device may be of any suitable type, for example in some embodiments it comprises an audio input device and optionally a microphone, and a method of the invention may comprise the steps: searching a network for a sound emitting device; identifying whether the sound emitting device has previously been configured; retrieving configuration data in relation to the sound emitting device from a data store.

The method of the invention may further comprise the steps of: detecting sound at the audio input device wherein the sound comprises one or more of: sound from the sound emitting device; sound from one or more other sound emitting devices and other sound such as ambient sound; converting the sound to a digital signal which optionally comprises identity data to associate the signal with the sound emitting device; communicating the digital signal to a computing device; identifying the digital signal as relevant to operation of the sound emitting device; analysing the digital signal to identify an output corresponding to an adjustment in the operation of the sound emitting device; communicating the output to the sound emitting device.

The analyzing step may comprise any suitable sub steps, in some preferred embodiments, it comprises: generating an RMS value from the digital signal; generating a volume value from the audio input device data; using the RMS value to identify an expected volume value based on the configuration data; comparing the audio input device volume value to the expected volume value to identify a difference; identifying an adjustment in expected volume for the sound emitting device based on the difference; optionally communicating an instruction to the sound emitting device corresponding to the adjustment in expected volume.

The detecting step may comprise any suitable substeps preferably it comprises: receiving a signal from the audio device; sending a signal on a network to request a response from an audio device wherein optionally the response is only requested of unregistered devices; polling for unregistered devices; using an introduction protocol; sending a signal via peripheral to request a response from a computer's process wherein optionally the response is only requested of unregistered devices.

The data associated with the audio device may be of any suitable type, in some preferred embodiments it comprises one or more of: an identification tag or code or number, specification data, manufacturer data, audio device capabilities, device physical attributes, network configuration settings, one or more operational attributes (which are optionally selected from current temperature, geographical location (such as GPS coordinates)), Application Programming Interface, generic interface/gateway information and pre-configured identity data.

The data store may be located in any suitable place, for example optionally locally or remotely and in some embodiments it is located locally and optionally is comprised within the computing device undertaking the steps of the method, or in a separate computing device but at the same location. In some embodiments, the data store is located remotely and optionally on a server connected to the internet.

The receiving step may comprise any suitable substeps, for example it may comprise loading configuration data into a data store associated with the computing device operating the steps of the method.

In another aspect of the invention, there is provided a method of calibrating a sound system comprising the steps of: detecting a first sound at an audio input device during a period of x seconds where in x is optionally 1 to 10 seconds, optionally 2 to 8 seconds, optionally 3 to 7 seconds; converting the first sound to a digital signal; generating audio input device data for the first sound; generating an RMS value for the first sound from the audio input device data; generating a volume value for the first sound received by the audio input device data; associating the generated first sound RMS value with the first sound volume value; detecting a second sound wherein the second sound is different to the first sound and optionally different in volume at an audio input device during a period of x seconds where in x is optionally 1 to 10 seconds, optionally 2 to 8 seconds, optionally 3 to 7 seconds; converting the second sound to a digital signal; generating audio input device data for the second sound; generating an RMS value for the second sound from the audio input device data; generating a volume value for the second sound received by the audio input device data; associating the generated second sound RMS value with the second sound volume value.

In some preferred embodiments, the steps of this aspect are repeated by increasing the volume of each sound until a maximum tolerable ambience is reached wherein the maximum tolerable ambience is optionally estimated.

In some embodiments, the method according to this aspect of the invention comprises the step of setting a maximum working range based on the conditions on reaching the maximum tolerable ambience and wherein optionally the maximum working range comprises a maximum setting corresponding to a maximum level of sound emitting device output.

In some embodiments of this aspect of the invention the second sound is of greater volume than the first and optionally any subsequent sounds successively increase in volume and in some embodiments, each sound is computationally generated from one or more sound emitting devices as part of the method.

Some embodiments of this aspect of the invention comprise the step of identifying for each sound level an ideal volume for each sound emitting device associated with the system at their respective locations. In some embodiments, configuration data comprises one or more of an ideal volume, a minimum setting and a maximum setting as herein described.

In another aspect of the invention there is provided a method of managing an audio device comprising the steps of: receiving data associated with operation of the sound emitting device at a predetermined location; processing said data to determine an operating characteristic of that device for that location; searching a data store for historical operating characteristic data associated with the device and location; comparing the operating characteristic data with the historical data; optionally storing the results of said comparison in a data store; optionally communicating the results of said comparison to a computing device; optionally generating one or more output instructions based on the results of the comparison.

In another aspect of the invention there is provided a system for managing a sound emitting device comprising: a sound emitting device; an audio input device; a data store; a computing device in communication with said sound emitting device and with said audio input device and with said data store; wherein said computing device is adapted to process data received from the audio input device optionally based on data from the data store and communicate one or more instructions to the sound emitting device based on said processing.

Communication with the computing device may be of any suitable type, for example in some embodiments it comprises communication over one or more of a wireless network a telecommunications network and the internet. In some aspects the system comprises a second computing device to respond to queries from the first computing device in relation to attributes of one or more of the sound emitting device and the audio input device. In some embodiments, the computing device is optionally physically located: in co-location with one or more of a sound emitting device and an audio input device; or within the same housing as one or more of a sound emitting device and an audio device.

Some implementations of a system according to the invention comprise a plurality of sound emitting devices and some comprise a plurality of audio input devices each of which can be managed independently of one another or in one or more groups. Some preferred embodiments comprise a plurality of both sound emitting devices and audio input devices. Some embodiments comprise a plurality of processors.

A particular feature of certain embodiments of the invention is that management of sound within the space can be done based on the direction and location of the source of various sounds (whether people, sound emitting devices, or outside noise etc) and adjustments can be specific to sub locations within the space. In some embodiments, all of this is done in real time which greatly enhances control of sound in each part of the space, as well as overall.

Another important feature of certain embodiments of the invention is that pre-configuration and/or calibration which may for also be combined with machine learning provides accurate, localised data to assist with sound adjustment and management. This learning about the local environment is ongoing and cumulative and incorporates prior learnings and data.

A further important feature of certain embodiments of the invention is the ability to manage not only sound volume and at various sub-locations within the space, but also to manage other aspects of the sound including content.

Throughout this specification (including any claims which follow), unless the context requires otherwise, the word 'comprise', and variations such as 'comprises' and 'comprising', will be understood to imply the inclusion of a stated integer or step or group of integers or steps but not the exclusion of any other integer or step or group of integers or steps.

BRIEF DESCRIPTION OF THE DRAWINGS

FIG. 5b is a representation of how speakers react to ambient noise decreases.

DETAILED DESCRIPTION OF EXEMPLARY EMBODIMENTS

Figure 1:
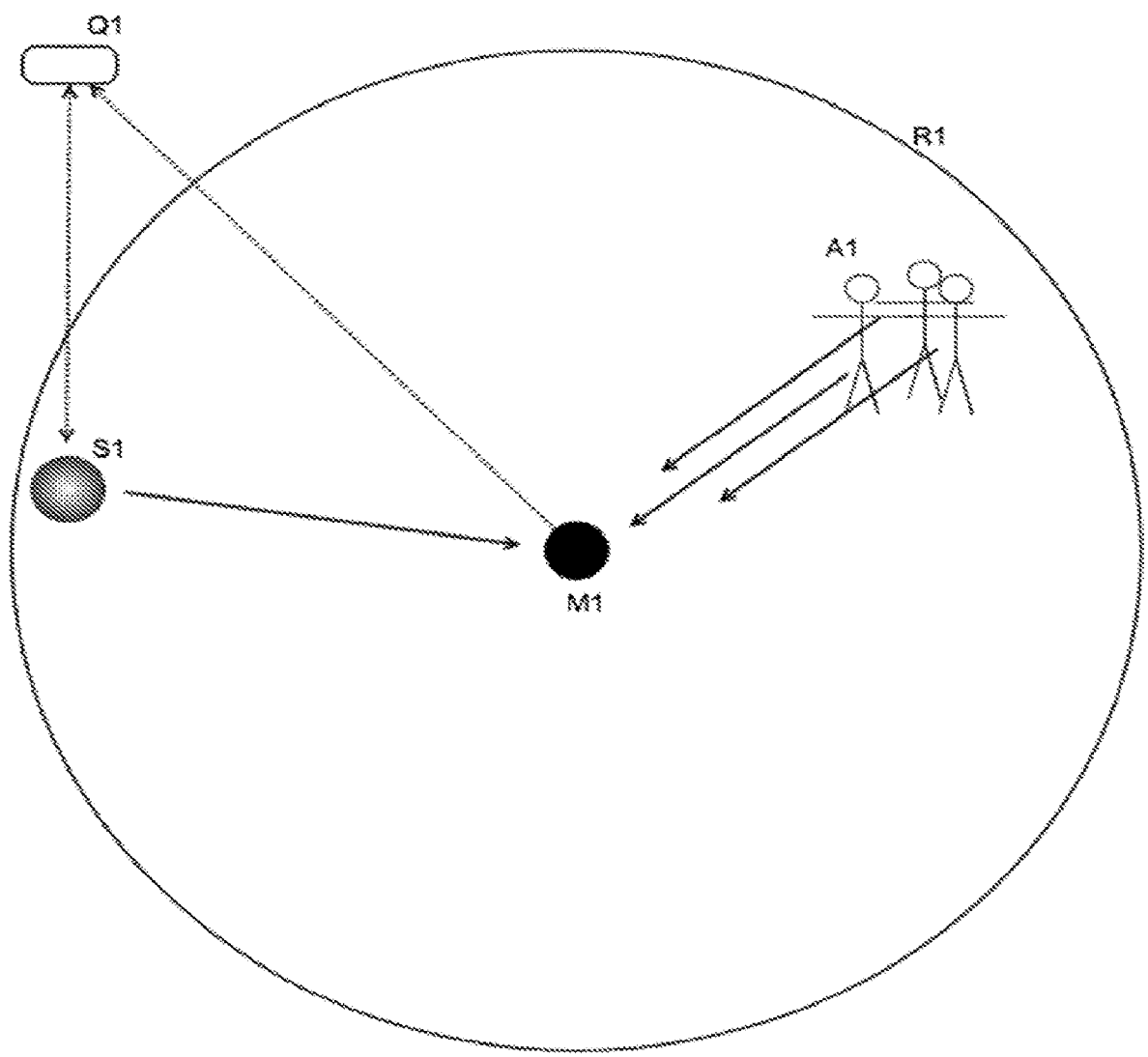
FIG. 1 is a schematic representation of a speaker and ambient noise point sending sound to a Microphone and Qbit which controls the speakers volumes.

It is convenient to describe the invention herein in relation to particularly preferred embodiments referred to in at least partially as AVA as an example implementation by Qsic and incorporating an example controller referred to herein from time to time as the Qbit. In these example embodiments, the Qsic API is used to refer to an Application Programming Interface housed on one or more computing devices which are in communication with the controller. In some preferred embodiments, the Qsic API is remote and may for example be accessed via the internet or another network or communications link. However, the invention is applicable to a wide range of implementations and it is to be appreciated that other constructions and arrangements are also considered as falling within the scope of the invention. Various modifications, alterations, variations and or additions to the construction and arrangements described herein are also considered as falling within the ambit and scope of the present invention.

AVA is an improvement over simple flat level decibel based volume adjustments on groups of speakers. In some implementations AVA uses multiple microphones to identify the location of noise and the levels of noise at those locations, then algorithmically adjusts the individual speakers based on each speaker's proximity to the microphone and the speakers ideal volume against an aggregated input value. This is all done in real-time and on a one to one basis for each individual speaker and the origin of the noise.

In some implementations, AVA uses network/internet enabled speakers, this means that far more than just volume may be being controlled. Other levels of adjustment might for example include, but are not limited to: perceived loudness (individual frequencies) when listening at low volumes, sound morphing, speech clarity, Bass, Treble, Balance and anything else a speaker (preferably an intelligent speaker) can be used to control. In some embodiments the system of the invention may adjust one or more characteristics of queued or live content to fit the environment and circumstances at hand. In some embodiments, the system may for example tailor content to the current audience by normalising or setting levels in content prior to playing. This may for example be done when the content is loaded into the system of the invention so that it is ready for any future use, or a set time before it is scheduled to be played, or at any other suitable time. Such tailoring of content may in some embodiments be temporary—for example only for the purpose of playing at that venue at that time, or it may be more longstanding, for example for a particular venue or audience, etc irrespective of when it is played.

In some implementations, the system and method of the invention also comprises a learning algorithm. In such implementations, over time AVA, utilising the Qsic API and infrastructure, will learn how different store/venue purchasing conditions sound and can make adjustments based on that. This includes, but not limited to; content adjustment, triggering in-store promotions, notifying in real time other digital services about upcoming changes in the in-store/venue environment and sentiment analysis.

Figure 7:
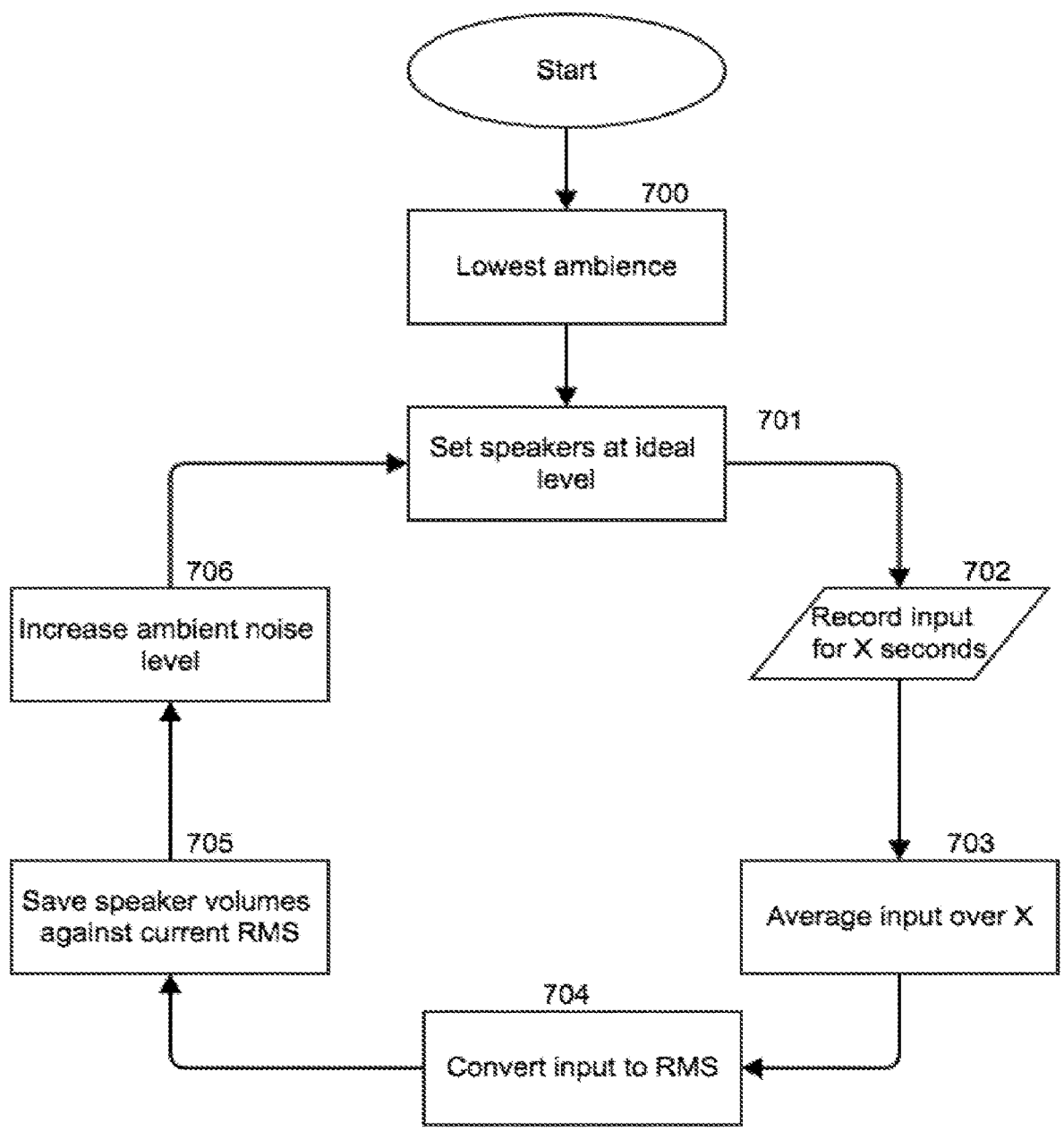
FIG. 7: is a schematic describing one method for system calibration.

An important element of the invention is the sensing of information in the managed environment and feedback of that information to a processor which makes adjustments accordingly. In some embodiments, this may comprise a microphone. In some embodiments, a configuration algorithm may be run, which for example may assess and set minimum and maximum parameters (for example volume level) the speakers can be set to. Preferably such configuration is undertaken under specific room conditions. FIG. 7 is a schematic showing one example configuration algorithm.

As the room becomes louder (for example, through more people entering, talking more loudly, machines being switched on) the system according to the invention can adjust the speakers (which may be intelligent speakers) so that the music is always at an audible level. By doing this the sound reading that is recorded by the microphone will for example increase with increasing background noise.

When calibrating a system, each speaker's volume (measured as a 0-100 percentage) is recorded against a specific microphone reading which represents an ambient level in the space, which might be for example a venue room. In some embodiments, speakers volumes may not be recorded as a percentage, but some other measure, for example the unit relative to the speaker manufactures specification. This serves as the basis for the equation of the speaker that will be used to find its ideal volume at any point in time. Multiple readings are preferably carried out as there is a high point and a low point in the ambient noise. The more of such recordings that are undertaken, the more information the controller will have in order to create the equation needed to adjust each speaker's volume levels.

Once sufficient data points have been obtained, the system can algorithmically create an equation to describe the relationship and create a graph of each speaker's volume vs the overall microphone reading. This allows the speakers to be adjusted by a controller such as the Qbit in response to varying noise levels as detected by the sensor (such as a microphone).

In some embodiments the way each speaker is controlled is tied to the application on a device comprising a processor on a network, for example a Local Area Network (LAN), which is preferably located within the venue to provide as 'real-time' adjustments as possible.

In one example algorithm, the formula that has been prepared according to the process set out above allows the system to monitor each speaker to run the equation every x seconds which determines how often each speaker is updated with a new volume. In some preferred embodiments, x is a number in the range of 1 and 10, but it may also be larger or smaller as practically required for each implementation. For systems that need speakers to be updated more often a lower number should be favoured. The formula that is generated for each speaker may for example be dependent on the power output (for example, peak data input, decibel level. RMS values) vs the volume of the speaker.

In other example implementations, another characteristic is measured and used to adjust operation of a speaker. For example, "perceived loudness", may be used, for example by applying an approximate logarithmic relationship filter to the raw data to modify the Power.

Other characteristics which may be measured for the purpose of determining the relationship to use to adjust operation of a speaker, might for example comprise equal loudness contours or decibels.

An example of RMS for this invention is a set of "data frames", where data frames is a section of data streamed into the Qbit from the microphone, which are passed into the rms formula which can generally be expressed as. This gives us the average 'power' of the data stream over a period of time.

$$x_{rms} = \sqrt{\frac{1}{n}(x_1^2 + x_2^2 + \ldots + x_n^2)}.$$

RMS values are a way of referring to a speaker's power which is averaged over time. Since the power of an alternating current waveform supplying a speaker varies over time, audio power is typically measured as an average over time. An approximation of this can be obtained by making the assumption that it is a purely resistive load and using the root mean square (RMS) values of the voltage and current waveforms. An example formula according to this method is:

$$P_{avg} = V_{rms} \cdot I_{rms}$$

Where P=power, V=voltage and I=current.

In order to identify a new, adjusted speaker volume, a computing device, such as a Qbit, creates a formula for that speaker. It first receives an array of pre recorded RMS and Volumes which are used to create a vector of coefficients and least squares polynomial fit.

As a general example Curve Fitting is used to create a polynomial which gives the ability to evaluate the a volume when an RMS value is passed in. As a basic example Volume=x^2+2x+b, where x is RMS.

As a further example, using Python, to fit a polynomial p(x)=p[0]*x**deg+ . . . +p[deg] of degree deg to points (x, y). The following returns a vector of coefficients p that minimises the squared error.

Parameters x: array_like, shape (M,)

x-coordinates of the M sample points (x[i], y[i]).

y: array_like, shape (M,) or (M, K)

y-coordinates of the sample points. Several data sets of sample points sharing the same x-coordinates can be fitted at once by passing in a 2D-array that contains one dataset per column.

deg: int
Degree of the Fitting Polynomial
rcond: float, optional
Relative condition number of the fit. Singular values smaller than this relative to the largest singular value will be ignored. The default value is len(x)*eps, where eps is the relative precision of the float type, about 2e-16 in most cases.
full: bool, optional
Switch determining nature of return value. When it is False (the default) just the coefficients are returned, when True diagnostic information from the singular value decomposition is also returned.
w: array_like, shape (M,), optional
Weights to apply to the y-coordinates of the sample points. For gaussian uncertainties, use 1/sigma (not 1/sigma**2).
cov: bool, optional
Return the estimate and the covariance matrix of the estimate If full is True, then cov is not returned.

Returns p: ndarray, shape (deg+1,) or (deg+1, K)
Polynomial coefficients, highest power first. If y was 2-D, the coefficients for k-th data set are in p[:,k].
residuals, rank, singular_values, rcond
Present only if full=True. Residuals of the least-squares fit, the effective rank of the scaled Vandermonde coefficient matrix, its singular values, and the specified value of rcond. For more details, see linalg.lstsq.
V: ndarray, shape (M,M) or (M,M,K)
Present only if full=False and cov'=True. The covariance matrix of the polynomial coefficient estimates. The diagonal of this matrix are the variance estimates for each coefficient. If y is a 2-D array, then the covariance matrix for the 'k-th data set are in V[:,:,k]

Notes:
The solution minimizes the squared error $$E = \sum_{j=0}^{k} |p(x_j) - y_j|^2$$

in the equations:

$$x[0]^{**}n^* p[0] + \ldots + x[0]^* p[n-1] + p[n] = y[0]$$
$$x[1]^{**}n^* p[1] + \ldots + x[1]^* p[n-1] + p[n] = y[1]$$
$$\ldots$$
$$x[k]^{**}n^* p[0] + \ldots + x[k]^* p[n-1] + p[n] = y[k]$$

The coefficient matrix of the coefficients p is a Vandermonde matrix.

This can then be used to identify (for example from a lookup table) a speaker's new volume to match any RMS value.

In layman's terms, a speaker will have an ideal volume vs a specific RMS value. The algorithm will make an adjustment to a speaker's volume to attempt to get it closer to its ideal value. This adjustment has parameters such as the maximum increase amount (to stop large sudden jumps in volume), maximum and minimum volume levels (which determine the speakers working range), how often each reading should be taken and how often each adjustment should be made.

In practice, in some embodiments, the Qbit will obtain an RMS value for a period of time, x seconds (wherein x seconds is as defined above) from the microphone and will hold that value until it gets the next one. The process controlling each speaker on the Qbit will request or be sent that value from the process managing the microphone input at separate intervals allowing it to make its own adjustments accordingly. Thus creating the autonomous volume adjustment.

The following key explains the various components used in each figure.

M: Microphone. Input
R: Radius of the Microphone (M) circumference of input
S: Speaker.
A: Ambient Noise origin
Q: Qbit device
API: Qsic API. (Application Programming Interface)
DS: Digital Service.

FIG. 1 is a schematic representation of a single point of Noise origin to a single speaker.

In FIG. 1 a Microphone M1 which can detect sound within the region of radius from M1 denoted by circumference R1, receives sound input from speaker S1 and noise origin A1. The combined volume of the sound emanating from A1 and S1 will decrease as it travels to M1 where it is converted to an electrical signal and sent to the Qbit Q1 which receives the signal, recognises it as associated with microphone M1 and therefore speaker S1 and runs an algorithm associated with speaker S1, generating an output and sends a signal to speaker S1 to adjust the speaker volume S1.

Figure 2:
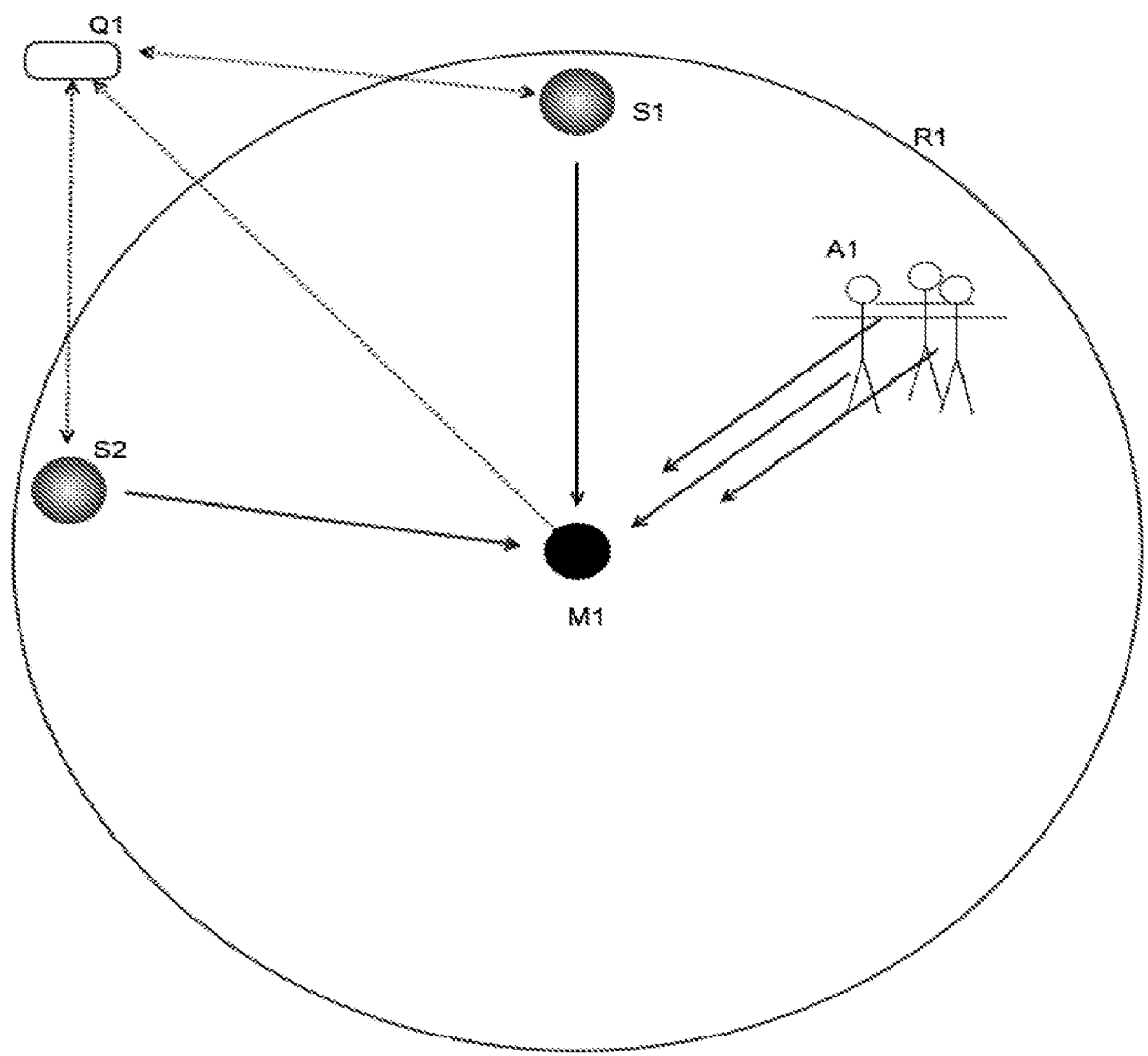
FIG. 2 is a schematic representation of multiple speakers and ambient noise point sending sound to a Microphone and Qbit which controls the speakers volumes.

FIG. 2 is a schematic representation of a single point of noise origin to multiple speakers. Microphone M1 which can detect sound within the region of radius from M1 within circumference R1, receives a combined sound input from speakers S1 and S2 along with ambient sound from A1. The combined volume of the sound emanating from A1 as well as S1 & S2 will decrease as it travels to M1 where it is then converted to an electrical signal and sent to the Qbit Q1 which recognises the signal as associated with microphone M1 and therefore speakers S1 and S2, runs one or more algorithms associated with one or more of speakers S1 and S2, generating one or more outputs and sends a signal to one or both of speakers S1 and S2 to adjust operation of speakers S1 & S2 accordingly.

Figure 3:
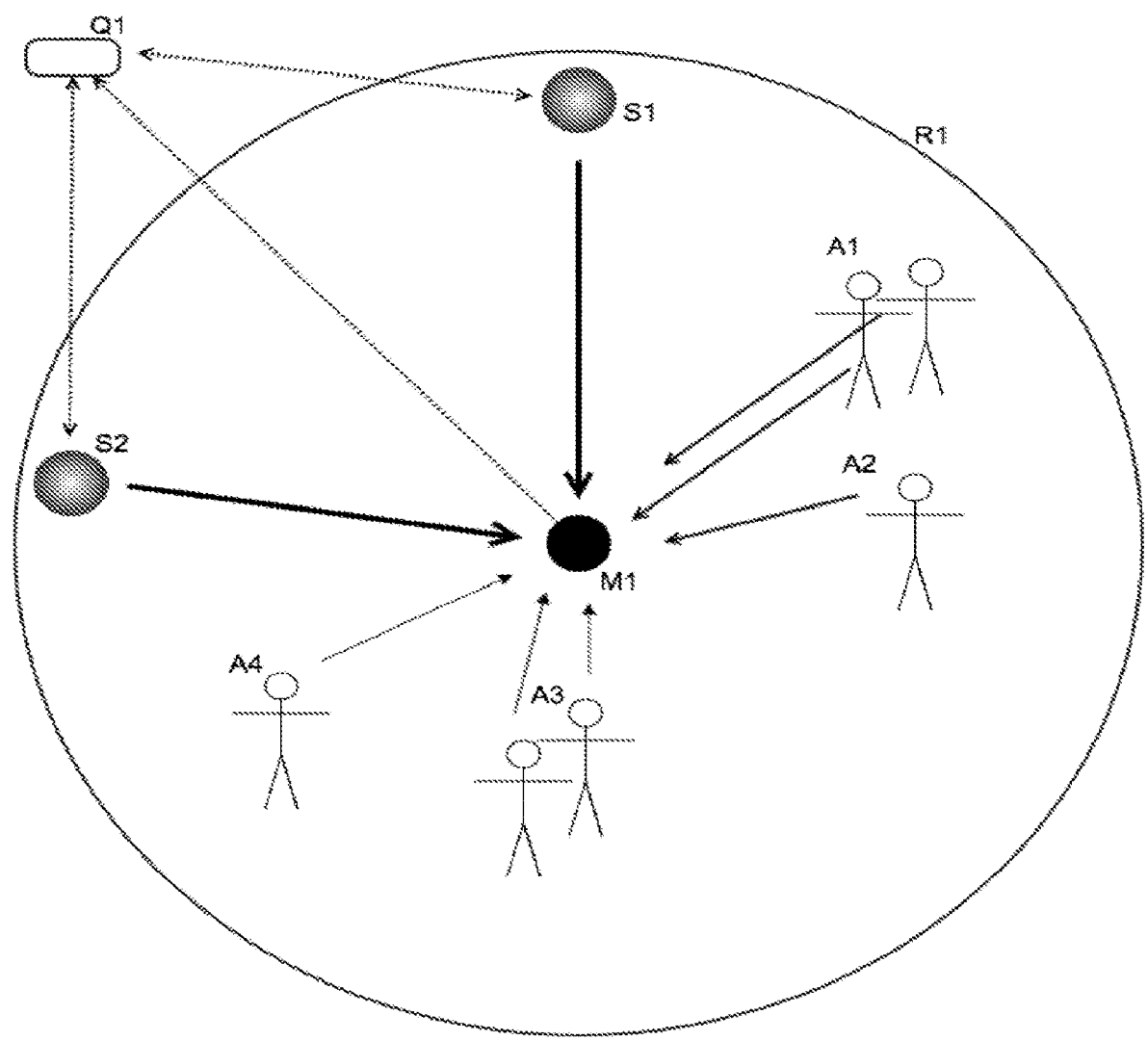
FIG. 3 is a schematic representation of multiple speakers and multiple ambient noise points sending sound to a Microphone and Qbit which controls the speakers volumes.

FIG. 3 is a representation of multiple points of noise to multiple speakers. Microphone M1 which can detect sound within the region of radius denoted by circumferences R1, receives a combined sound input from speakers S1 and S2 along with ambient sound from A1, A2, A3 and A4. The combined volume of the sound emanating from A1, A2, A3 & A4 as well as S1 & S2 will decrease as it travels to M1 where it is then converted to an electrical signal and sent to the Qbit Q1 which recognises the signal as associated with microphone M1 and therefore speakers S1 and S2, runs one or more algorithms associated with one or more of speakers S1 and S2, generating one or more outputs and sends signal to one or both of speakers S1 and S2 to adjust operation of speakers S1 & S2 accordingly.

Figure 4:
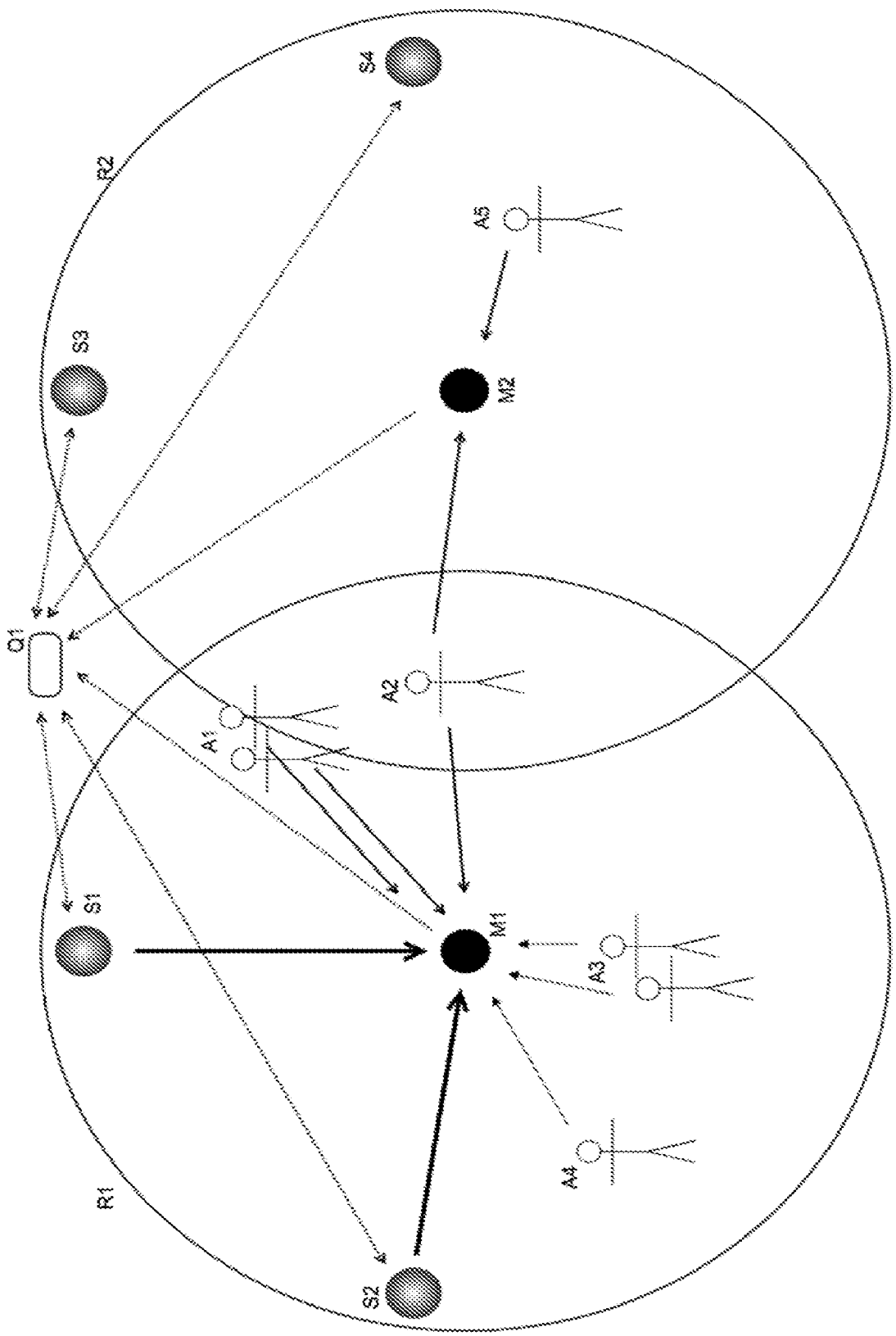
FIG. 4 is a schematic representation of multiple speakers and multiple ambient noise points sending sound to multiple Microphones and single Qbit.

FIG. 4 is a representation of multiple points of noise with multiple speakers split across multiple microphones M1 & M2. M1 which can detect sound within the region of radius denoted by circumferences R1 and will receive a combined sound input from speakers S1 and S2 along with ambient sound from A1, A2, A3 and A4. The combined volume of the sound emanating from A1, A2, A3 and A4 as well as S1 and S2 will decrease as it travels to M1 where it is then converted to an electrical signal and sent to the Qbit Q1 which recognises the signal as associated with microphone M1 and therefore speakers S1 and S2. The Qbit then runs one or more algorithms associated with one or more of speakers S1 and S2, generating one or more outputs and sends signal to one or both of speakers S1 and S2 to adjust operation of speakers S1 and S2 accordingly.

Staying with FIG. 4, M2 which can detect sound within the region of radius denoted by circumferences R2 will receive a combined sound input from speakers S3 and S4 along with ambient sound from A2 and A5. The combined volume of the sound emanating from A2 and A5 as well as S3 and S4 will decrease as it travels to M2 where it is then converted to an electrical signal and sent to the Qbit Q1 which recognises the signal as associated with microphone M2 and therefore speakers S4 and S5. The Qbit then runs one or more algorithms associated with one or more of speakers S4 and S5, generating one or more outputs and sends signal to one or both of speakers S4 and S5 to adjust operation of speakers S4 and S5 accordingly. In the case of A2, sound would be contributed to both Microphones as it impacts on both regions as defined by R1 and R2. M1 and M2 make no distinction between A2 and treat it as their own source as it falls in both M1 and M2's radius.

Figure 5A:
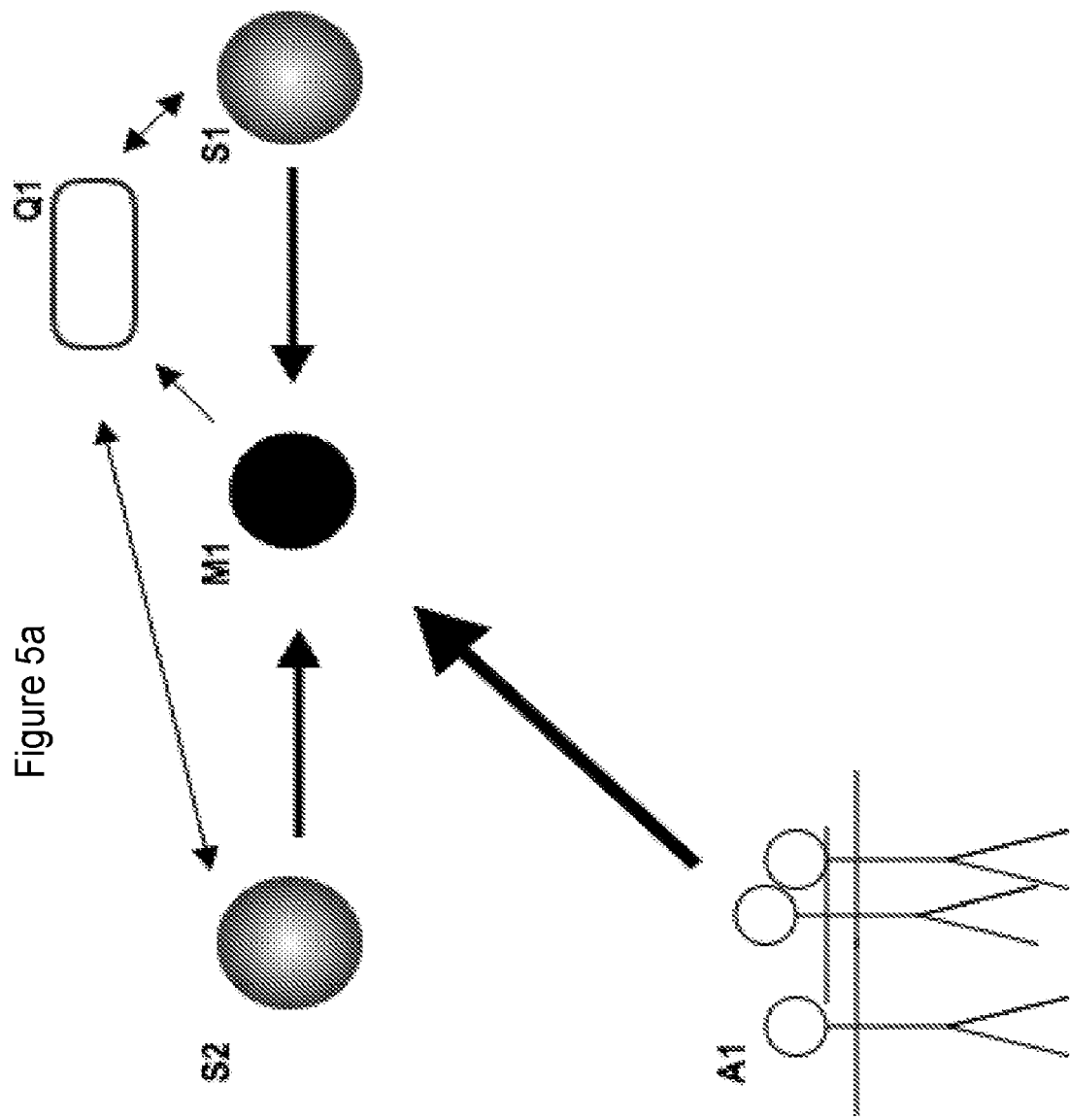
FIG. 5a is a schematic representation of how speakers react to ambient noise increases.

FIG. 5a shows Microphone M1 which can detect sound from speakers S1, S2 as well as ambient sounds from A1. On detecting sound, M1 sends microphone signal to Qbit Q1 which adjusts the volumes of S1 & S2 based on the combined ambient noise of the environment. The combined volume of the sound emanating from A1 as well as S1 & S2 will decrease as it travels to M1 where it is then converted to an electrical signal and sent to the Qbit Q1 which recognises the signal as associated with microphone M1 and therefore speakers S1 and S2, runs one or more algorithms associated with one or more of speakers S1 and S2, generating one or more outputs and sends a signal to one or both of speakers S1 and S2 to adjust operation of speakers S1 & S2 accordingly.

FIG. 5b is a representation of how speakers react to ambient noise decreases. FIG. 5b shows Microphone M1 which can detect sound from speakers S1, S2 as well as ambient sounds from A1, sends input to a Qbit Q1 which modifies the volumes of S1 & S2 based on the combined ambient noise of the environment. In this instance A1 has been reduced to show S1 & S2 with lower volumes.

Figure 6:
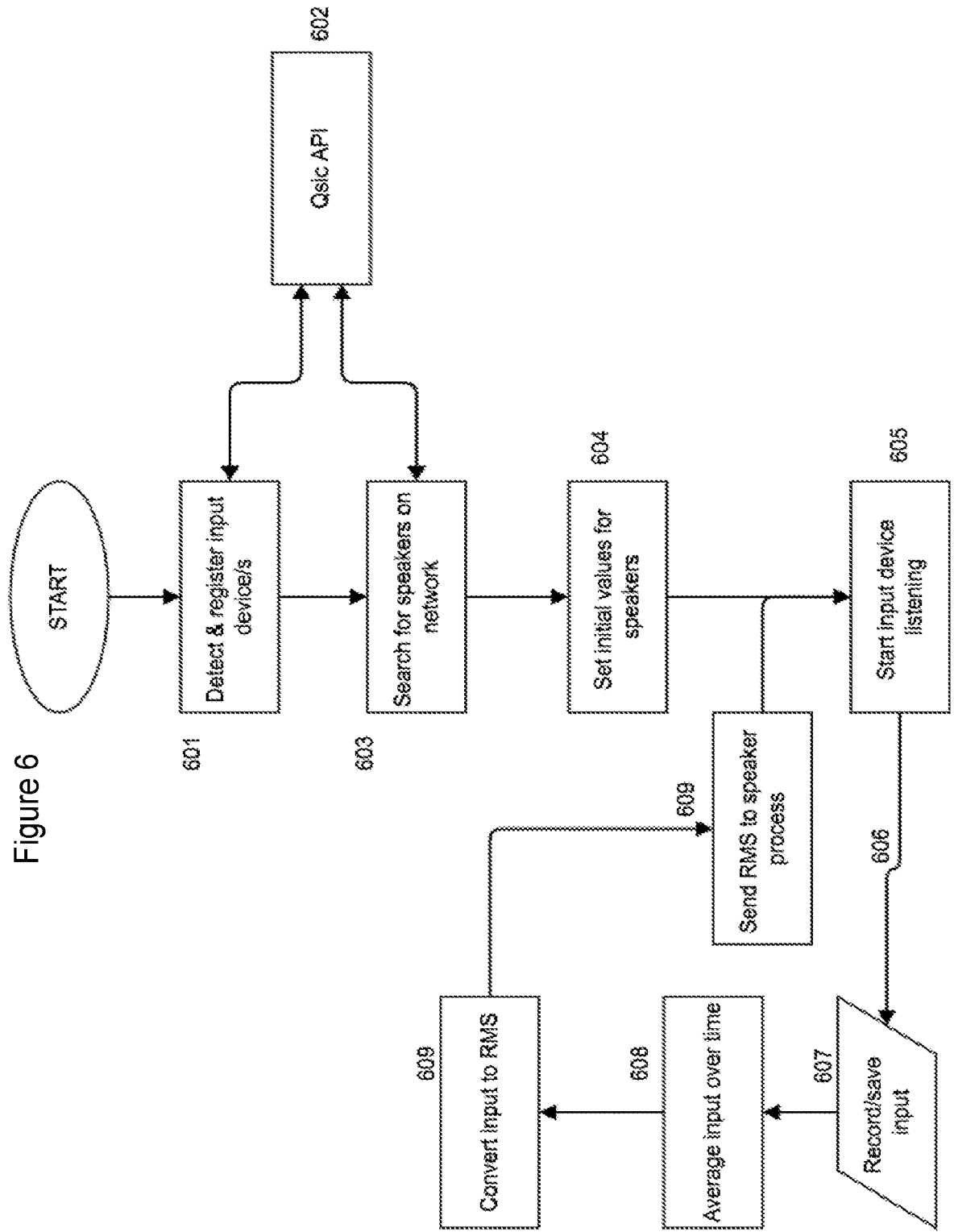
FIG. 6: is a schematic describing the way speakers are updated via the algorithm on a control device.

FIG. 6: Is a schematic describing the way speakers are updated via the algorithm on a control device (Qbit). The Qbit detects and registers 601 one or more input devices (audio input, such as a microphone) which may be a peripheral device or embedded/built into the Qbit device and sends a request to the Qsic API (Application Programming Interface) 602 to get the configuration for the particular audio device that has been added to the system. The API returns the configuration for the input device and loads the configuration. The Qbit searches the local network for speakers that have been previously configured 603 using the calibration method described in FIG. 7 and sends further requests to the Qsic API 602 to retrieve the calibration details for each speaker. This calibration will contain enough information to describe the relevant relationship and so make up the graph or equation described in FIG. 8. The Qbit will load the configuration and setup each speaker to be controlled via the identified algorithm 604.

Staying on FIG. 6, the process has now been initialised and the microphone is now actively sending a Digital Signal 605 to the Qbit which processes the digital signal as a stream of data 606 and saves it every x seconds, (where x may be any suitable number but is preferably a number in the range of 1 and 1), which determines how often each speaker is updated with a new volume. For systems that need speakers to be updated more often a lower number should be favoured. 607 so it can take a recording of the signal over time (x) 608 and create an average which can then be converted to an RMS value 609. With the RMS value the Qbit sends this to each sub-process 609 that is monitoring a speaker (such as a smart speaker) which in turn sends the volume adjustment instruction to the speaker to make an adjustment to its volume. As used herein, sub-process refers to a computer implemented task or routine or method which operates within a broader one. So in this example, it refers to a computer implemented method which monitors a pre-defined speaker by waiting for data relevant to the speaker to be transferred to it and responding accordingly (in this example, by sending an instruction relating to a volume adjustment to the speaker).

Figure 10:
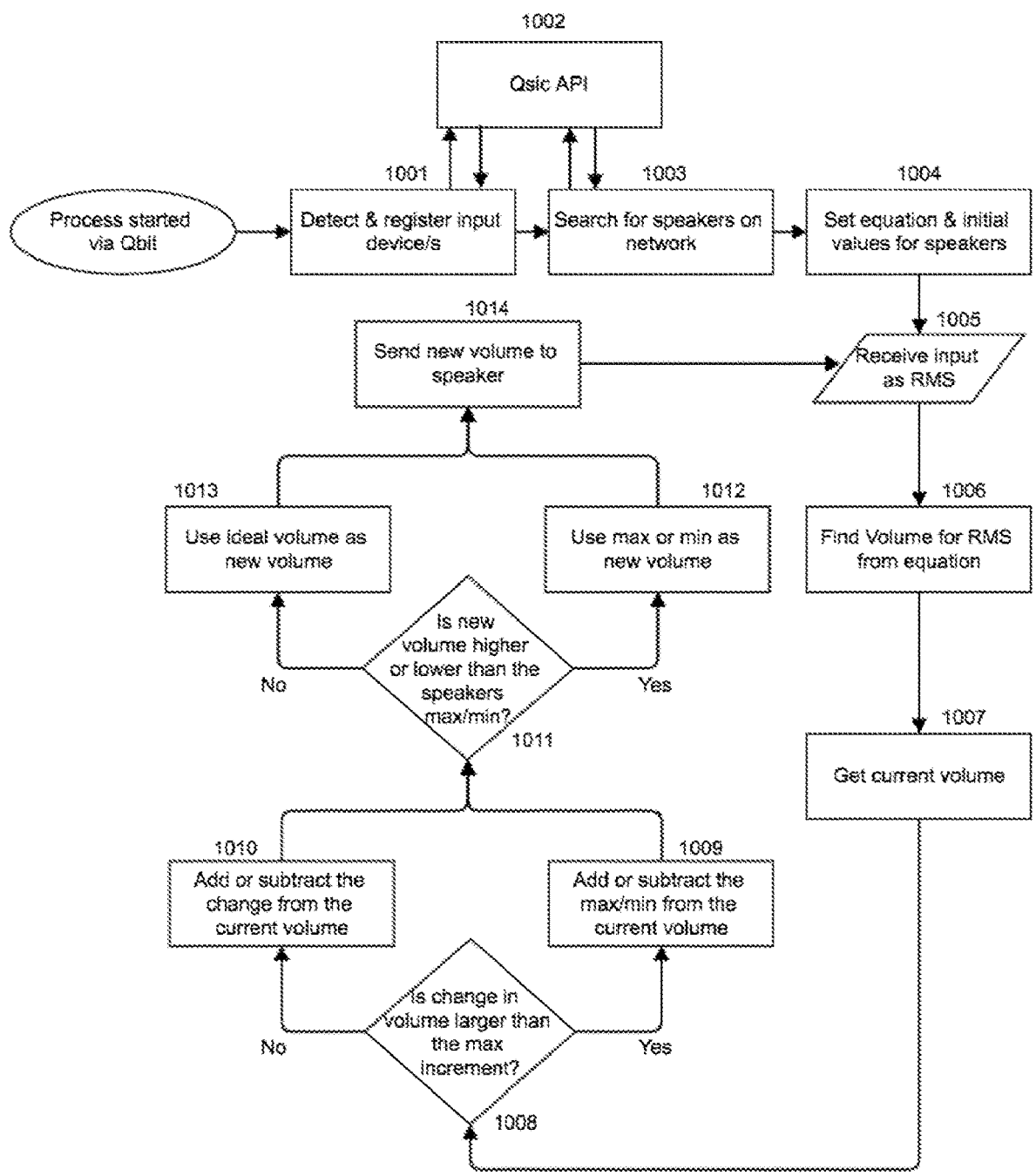
FIG. 10: is a schematic showing the overall process and decision flow from initialisation through to looping through the algorithm that determines the speakers new volume.

FIG. 7: is a schematic describing one example method for system calibration. Starting at 700 the system is set up when a room or venue has its lowest sound ambience—depending on the levels of outside noise, this may have to be in the middle of the night or another appropriate time. All speakers linked to the input device to be at their ideal volume 701 for when a room has little ambient sound, all speakers linked to the input device will have their minimum working range set to this volume. This minimum working range will mean the speaker cannot go below this volume, as seen in FIGS. 10-1011. The microphone records the ambient sound in the room 702 for x seconds, and the input stream 703 is averaged to then work out the RMS over the set timeframe 704. The number x can be any suitable value, typically it is in the range of 1 and 10. It determines how often each speaker is updated with a new volume. For systems that need speakers to be updated more often a lower number should be favoured. For each speaker the Qbit saves the RMS against the volume of the speaker 706. The ambient sound level is then increased for example by either waiting for more people to enter a venue or by simulating increasing ambience 706. In some embodiments, an increase in ambient sound (for example in a series of steps) is machine generated as part of a pre-programed calibration sequence. Once the ambience has increased the process flow can start again from 701. This process can repeat until a maximum ambience is reached, it has been found that in general it is preferable that a minimum of 4 data points are gathered to make a prediction using the polynomial equation described above. The more data points recorded the more accurate the prediction will be. Once a maximum ambience is reached all speakers linked to the input device will have their maximum working range set to this volume. This maximum working range will mean the speaker cannot go above this volume, as seen in FIGS. 10-1011. With the minimum and maximum volumes configured we have a working range of figures for each speaker.

Figure 8:
FIG. 8: is a graph showing how the ideal speaker volume is plotted against the Microphones input values as Root Mean Square (RMS) and volume.

FIG. 8: Is a graph showing an example resulting polynomial from the process described in FIG. 7. This shows how the new volume (y-axis) 802 is selected against the inputs average power output as Root Mean Square (RMS) (x-axis) 801 and volume. In FIG. 8 we can see how 2 speakers S1 & S2 have been calibrated by the points 803 on the graph to make up a polynomial formula which describes a curve which fits the data values from the previous explained calibration procedure in FIG. 7.

When a new RMS value is calculated on the Qbit, the Qbit uses that value to figure out what volume it should attempt to get for a particular speaker. For example referring to FIG. 8, if the RMS of the input device was 750 then S2 would attempt to get as close to 26 as possible. S1 would try to get to 41.

Figure 9:
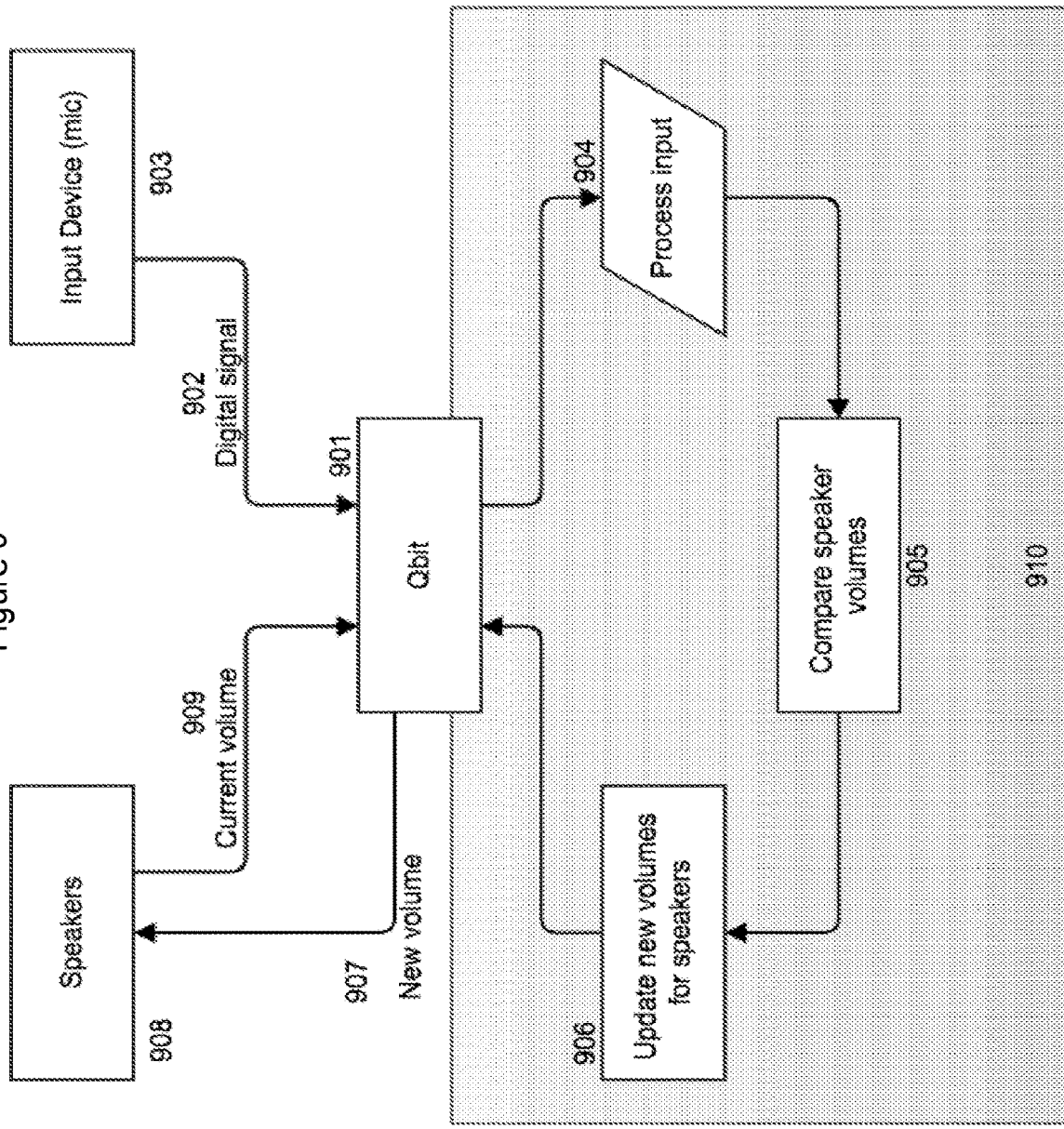
FIG. 9: is a schematic showing an example control device (referred to herein as Qbit) as the point of control.

FIG. 9: Is a schematic showing an example control device (referred to herein as Qbit) as the point of control. In this schematic F.910 represents the internal workings/algorithm on the Qbit while outside this box represents physical hardware and communications/connections with it.

FIG. 9 shows the Qbit 901 as the control device receiving a digital signal 902 from an input device (such as a microphone or decibel reader) 903. The signal may optionally be continuous or it may be periodic, for example set at a particular frequency. The Qbit 901, stores this digital signal and after x seconds. (where x may be any suitable number but is preferably a number in the range of 1 and 10), which determines how often each speaker is updated with a new volume. The Qbit 901 processes the digital signal 904 to produce a power variable, for example an averaged RMS over the period of time. The Qbit 901 after receiving the current volumes 909 of the speakers starts the process of comparing the power variable (here an averaged RMS) to the corresponding volume for each speaker 905 which has been configured using the process described in FIG. 7. Once a new volume has been found for a speaker 906 based on the input, a volume adjustment 907 is sent to the speaker 908.

FIG. 10 is an overview of an example process from the most top level and includes a flow of the decisions used to make adjustments to the speakers. FIG. 10 shows, starting at 1001 the Qbit detects and registers 1001 one or more input devices (such as a microphone) which may be a peripheral device or embedded/built into the Qbit and sends a request to the Qsic API (Application Programming Interface) 1002 to obtain the configuration for the particular audio device that is attached, the API returns the configuration for the input device and the configuration is loaded onto the Qbit. The Qbit searches the local network for speakers (such as smart or intelligent speakers) that have been previously configured 1003 using the calibration method described in FIG. 7 and sends further requests to the Qsic API 1002 to retrieve the calibration details for each speaker. This calibration will contain enough information to identify the relevant relationship and make up the graph or equation described in FIG. 8. The Qbit will load the configuration and setup each speaker to be controlled via the AVA algorithm 1004.

The process has now been initialised and the sub-process controlling the speaker on the Qbit is now receiving an RMS value 1005 from the sub-process controlling the microphone input every x seconds, where x is a number in the range of 1 and 10, which determines how often each speaker is updated with a new volume. For systems that need speakers to be updated more often a lower number should be favoured.

The Qbit looks up the ideal volume for each speaker based on the RMS input 1005 using the equation that was set in 1004 and obtains the speaker's current volume 1007.

The Qbit now has 3 variables stored for each speaker. An ideal volume, the current volume and the current RMS. The Qbit will process the speaker's current volume and ideal volume to identify whether any difference is larger than a preset maximum increment setting 1008. If it is larger, the Qbit saves the new volume as the current volume plus or minus (depending on if the new volume is higher or lower than the current volume) the maximum allowed increment for that speaker 1009. If the change is not larger than the maximum increment the Qbit either adds or subtracts the change from the current volume (depending on if the new volume is higher or lower than the current volume) to get the new volume for the speaker 1010.

The maximum increment may be set in any suitable manner. In some implementations, it is done manually by a user, for example based on the venue characteristics, and for example after or during the calibration process. In some embodiments, the maximum increment is computationally arrived at based on data processed at the venue/location of interest—for example data collected during a calibration process such as the one described herein.

For each speaker the Qbit holds a range that the speaker should operate in, which is defined by the maximum and minimum volume for each speaker during the configuration as per FIG. 7. This is to stop the volume getting too loud or too soft. The Qbit checks to see if the new volume for the speaker is higher or lower than the configured minimum or maximum volume 1011. If the new ideal volume is higher or lower than the configured maximum/minimum then the Qbit sets the ideal volume to be equal to the configured maximum/minimum of the speaker 1012. If the new volume is not higher or lower than the speakers maximum/minimum configured volume then the Qbit sets the ideal volume to be the passed in ideal value 1013. The Qbit then sends the new ideal volume to the speaker to set its own volume 1014.

For example if a speaker had a minimum allowed volume of 32 and maximum allowed volume of 66, its current volume was set to 50 the maximum increment was 3 and its ideal volume after running the RMS lookup 1006 was 56: 1008 would return Yes as the new volume is larger than the maximum increment allowed. 1009 would return 53 since the maximum increment is 3 and the current volume is set at 50. 1011 would return No since 53 is less than the speakers maximum allowed volume of 66. 1012 would pass 53 to 1014 and the speaker would set its new volume to be 53.

As a second example, if a speaker has a minimum allowed volume of 28 and a maximum allowed volume of 40, its current volume was set to 35, the maximum increment is 3 and its ideal volume after running the RMS lookup 1006 is 37: 1008 would return No as the new volume is not larger than the maximum increment allowed. 1010 would return would return 37 since the change in volume would only be is 2. 1011 would return No since the new volume (37) is lower maximum allowed volume (40). 1013 would pass 37 to 1014 and the speaker would set its new volume to be 37.

Figure 11:
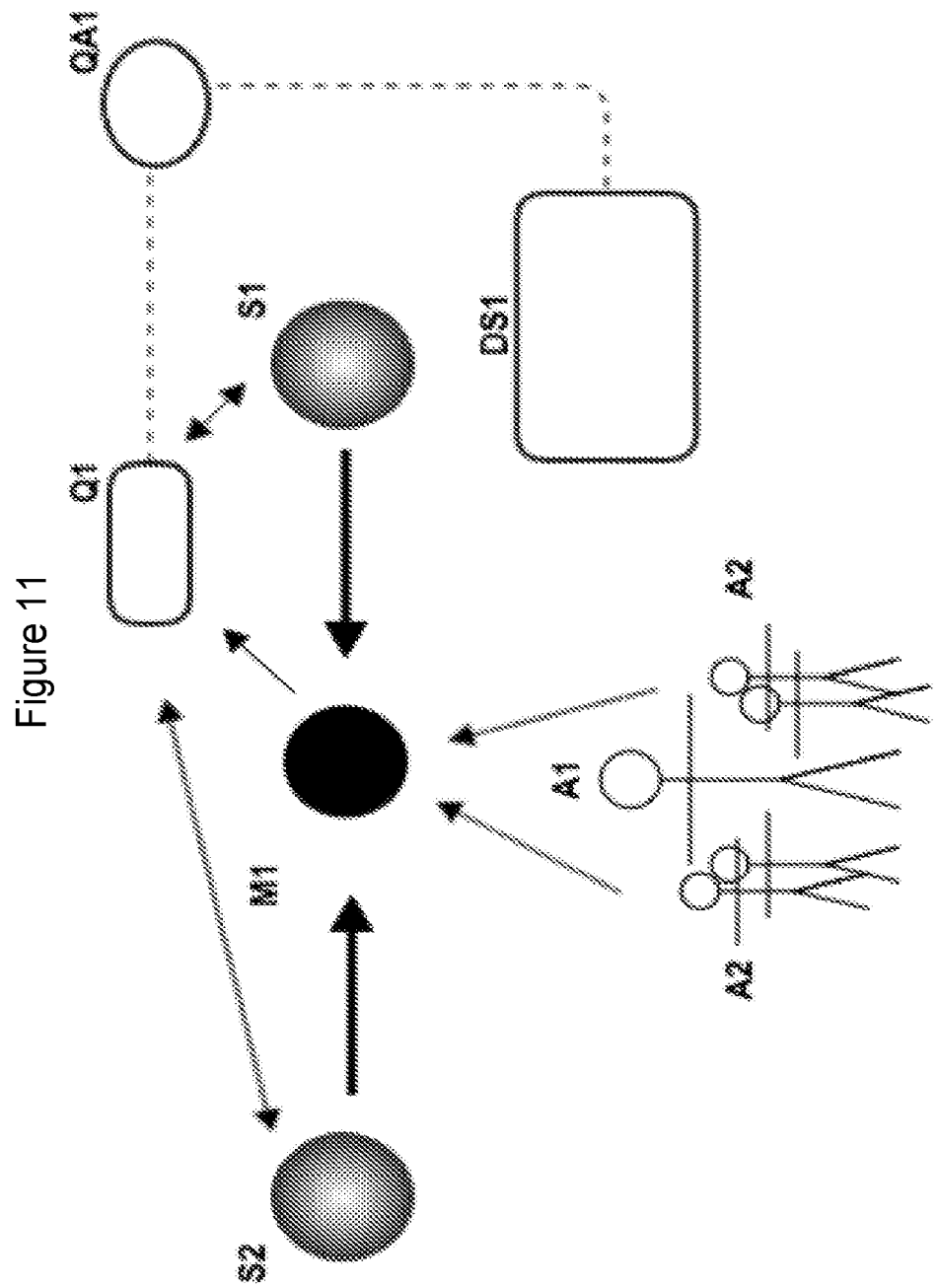
FIG. 11: is a representation of how AVA detects differences in pitch/tone from ambient noise and other sound factors and then alerts other digital services, IoT devices, etc.

FIG. 11 is a representation of a Microphone detecting a tonal/pitch change in the ambient noise and altering content on a digital service or screen. FIG. 11 shows a group of children A2, becoming the source of the majority of noise raising the tone/pitch/frequency input to microphone M1. M1 sends a digital signal to the Qbit Q1 which determines more children have entered the venue by analysing the attributes such as frequency, tone and pitch of the digital signal from M1. Q1 send this notification to the Qsic API QA1. Which notifies other digital services DS1 such as advertising, digital signage, etc. In some embodiments, the controller (such as a Qbit) is on site at the venue and can process such information without the need to communicate with the Qsic API. For example, the Qbit may identify one or more preset outputs based on the identified changes in attributes, such as frequency, tone and pitch, etc. Such an output may for example comprise a signal to a content controller to alter content which is played through one or more speakers, or displayed on one or more screens to match one or more characteristics of the altered audience A2. In some embodiments, the Qbit may further comprise a controller to control such content.

Figure 12:
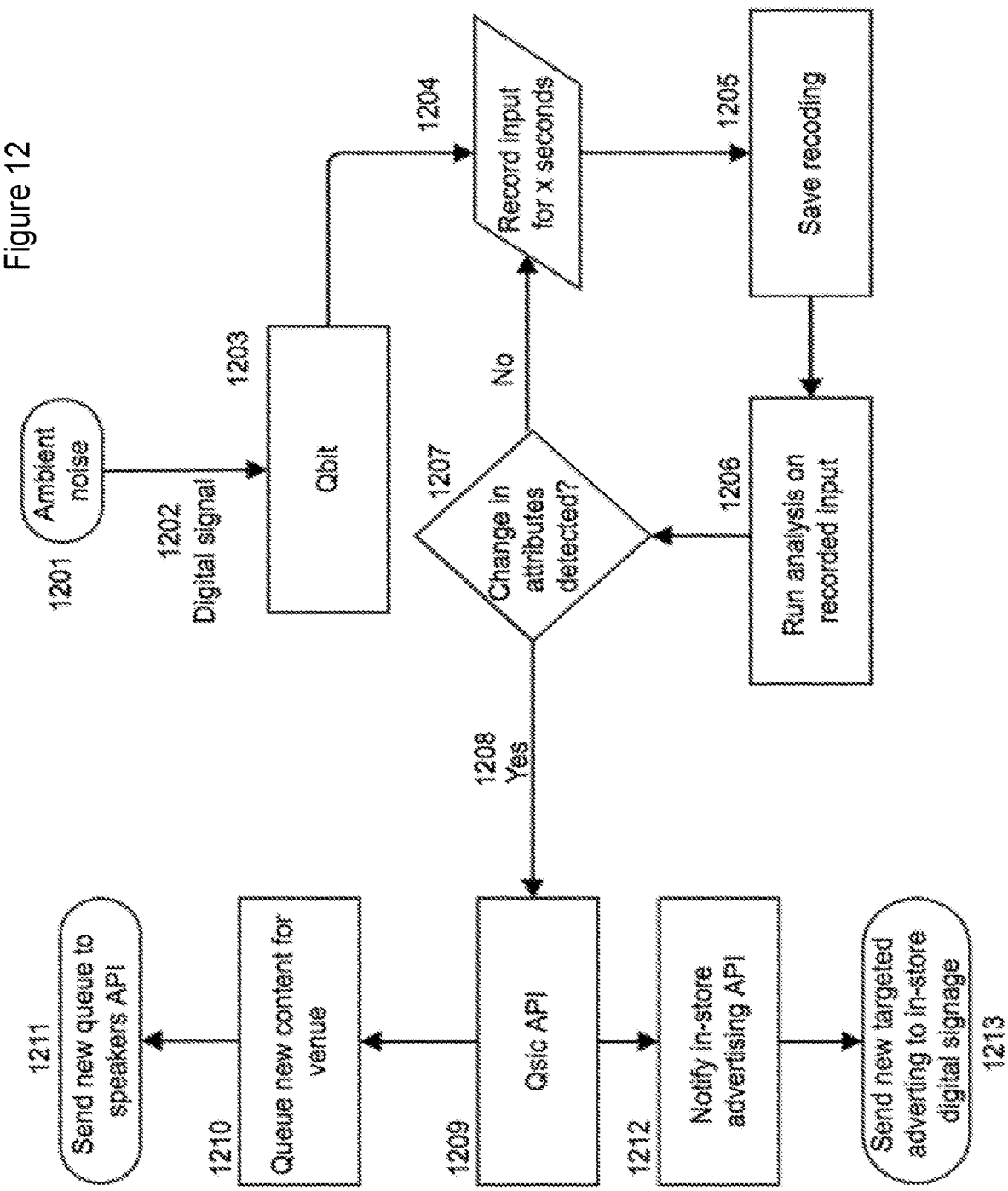
FIG. 12: is a schematic showing the flow/feedback loop for when AVA detects differences in pitch/tone etc, from ambient noise and passing this data to services, IoT devices, etc.

FIG. 12: is a flowchart showing the flow/feedback loop for when AVA detects differences in attributes from the ambient noise, passing this detection to the Qsic API and onto subscribed services. FIG. 12 shows ambient sound 1201 being sent as a digital signal 1202 to the Qbit 1203 which records the microphone input for x seconds 1204. The number 'x' may be of any suitable value, preferably it is a number in the range of 5 and 60 and determines the length of the sample of audio to analyse. A larger number will give a greater likelihood of detecting change, but will be less responsive, while a smaller number may pick up too many changes. This number will preferably be tested on a venue by venue basis before being implemented. The recording is saved 1205 and an analysis is run on the recording 1206 of x seconds to determine features of the audio clip from the tone/frequency/pitch etc. These features/attributes are compared to the previous recordings attribute's 1207 if a large enough difference is not found in the attribute changes the process continues from 1204. If a large enough change in features/attributes for example 1208, the average frequency has gone up and we have detected more children in the analysed sound, the change is sent to the Qsic API 1209 which alerts other digital services of this change. These could be Qsic internal services, 1210 for example shows new content being queued and then sent to play in the store 1211. Where 1212 shows an external service being notified and in turn changing the digital advertising in the store 1213. Again, in some embodiments, the Qbit may itself undertake these steps without the need to communicate with the Qsic API.

Figure 13:
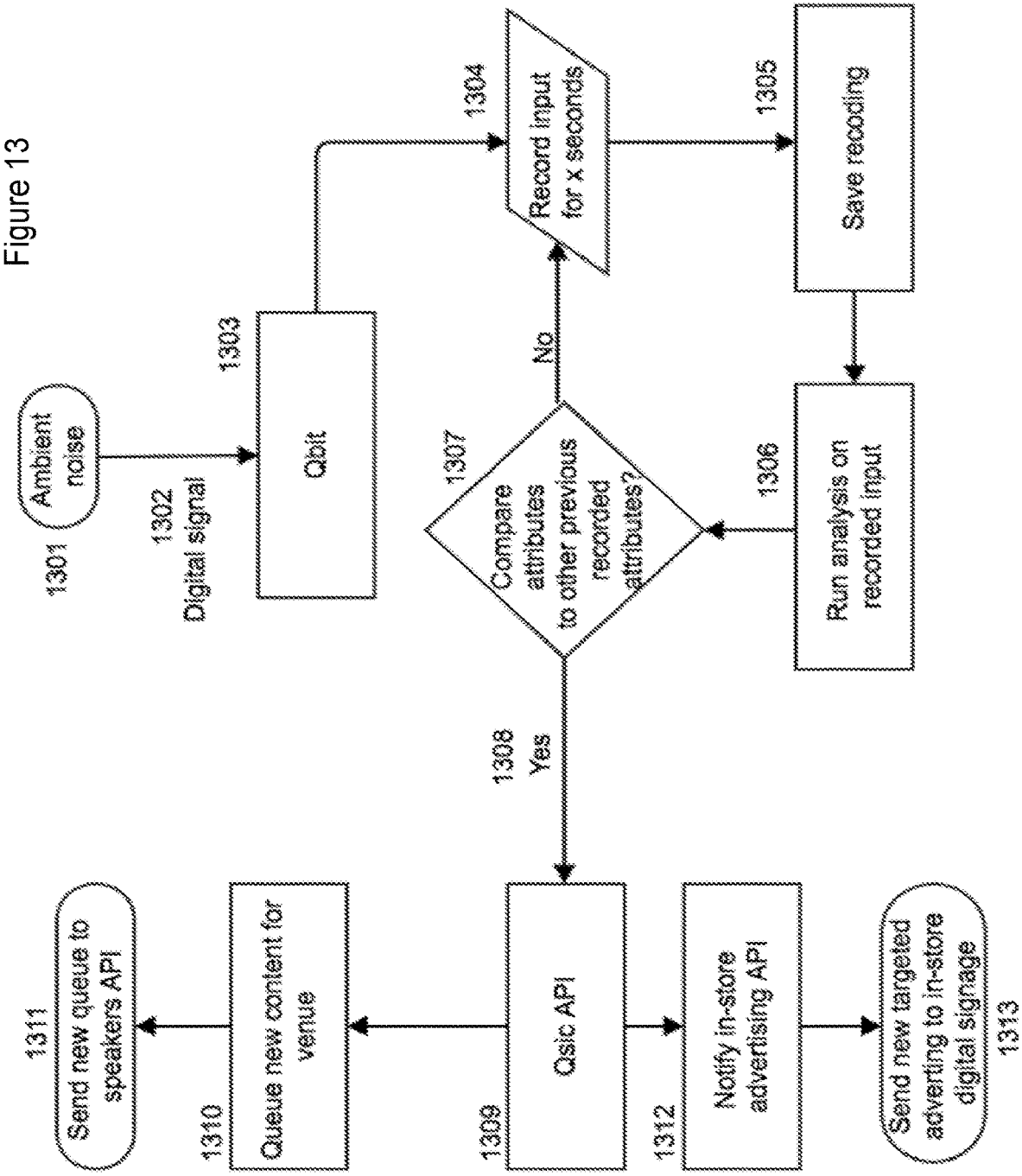
FIG. 13: is a schematic showing the flow of AVA's learning from historic data to predict/recognise events.

FIG. 13: is a schematic showing the flow of AVA's learning from historic data to predict/recognise events. FIG. 13 shows ambient noise 1301 being sent as a digital signal 1302 to the Qbit 1303 which records the microphone input for x seconds 1304. The number 'x' may be of any suitable value, preferably it is a number in the range of 5 and 60 and determines the length of the sample of audio to analyse. A larger number will give a greater likelihood of detecting change, but will be less responsive, while a smaller number may pick up too many changes. This number will preferably be tested on a venue by venue basis before being implemented. The recording is saved 1305 and an analysis is run on the recording 1306 of x seconds to determine features of the audio clip from the tone/frequency/pitch etc. These features/attributes are compared to previous recordings attribute's 1307 if no similar attributes are found the process continues from 1304. If a set of features/attributes for example 1308, the same features/attributes as the same time yesterday, the change is sent to the Qsic API 1309 which alerts other digital services of this change. These could be Qsic internal services, 1310 for example shows new content being queued and then sent to play in the store 1311. Where 1312 shows an external service being notified and in turn changing the digital advertising in the store 1313.

Figure 14:
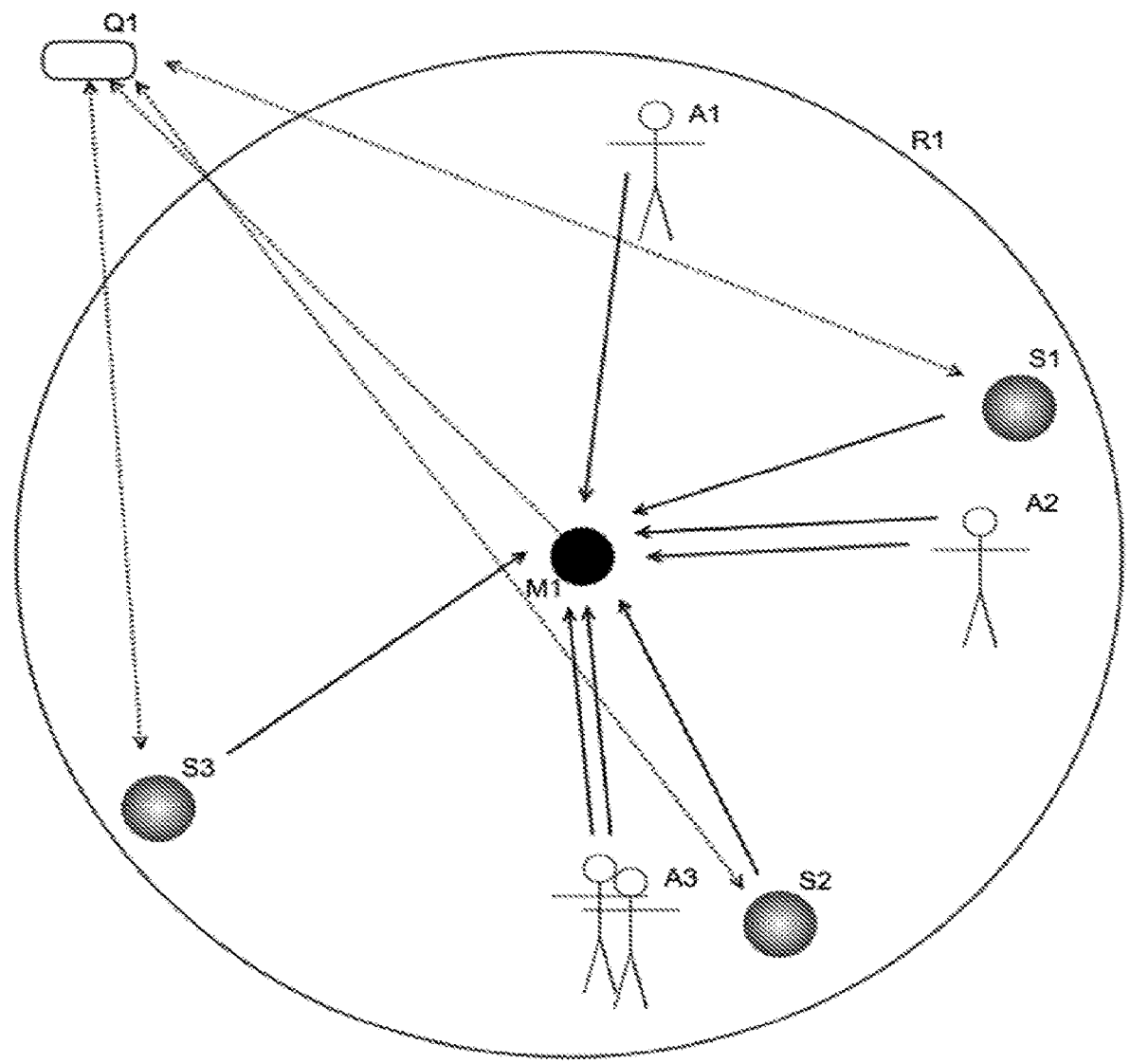
FIG. 14 is a schematic representation of multiple speakers and multiple ambient noise points sending sound to a Microphone and Qbit which controls the speakers volumes based on the direction of sound into the Microphone.

FIG. 14 is a representation of a microphone M1 detecting the direction of multiple points of noise with multiple speakers split across it to equally distribute volume to the audience in the room. M1 is responsible for collecting relevant noise and the noise's direction within the area defined by the radius encircled by circumference R1 which in turn controls the volumes of S1, S2 & S3. Noise collected from within R1 is processed as sound with a direction. In this example, M1, detects that more noise is coming from the direction of A3. And in turn raises the value of S2 with a higher intensity value to compensate for the greater amount of noise compared to S1 & S3.

Figure 15A:
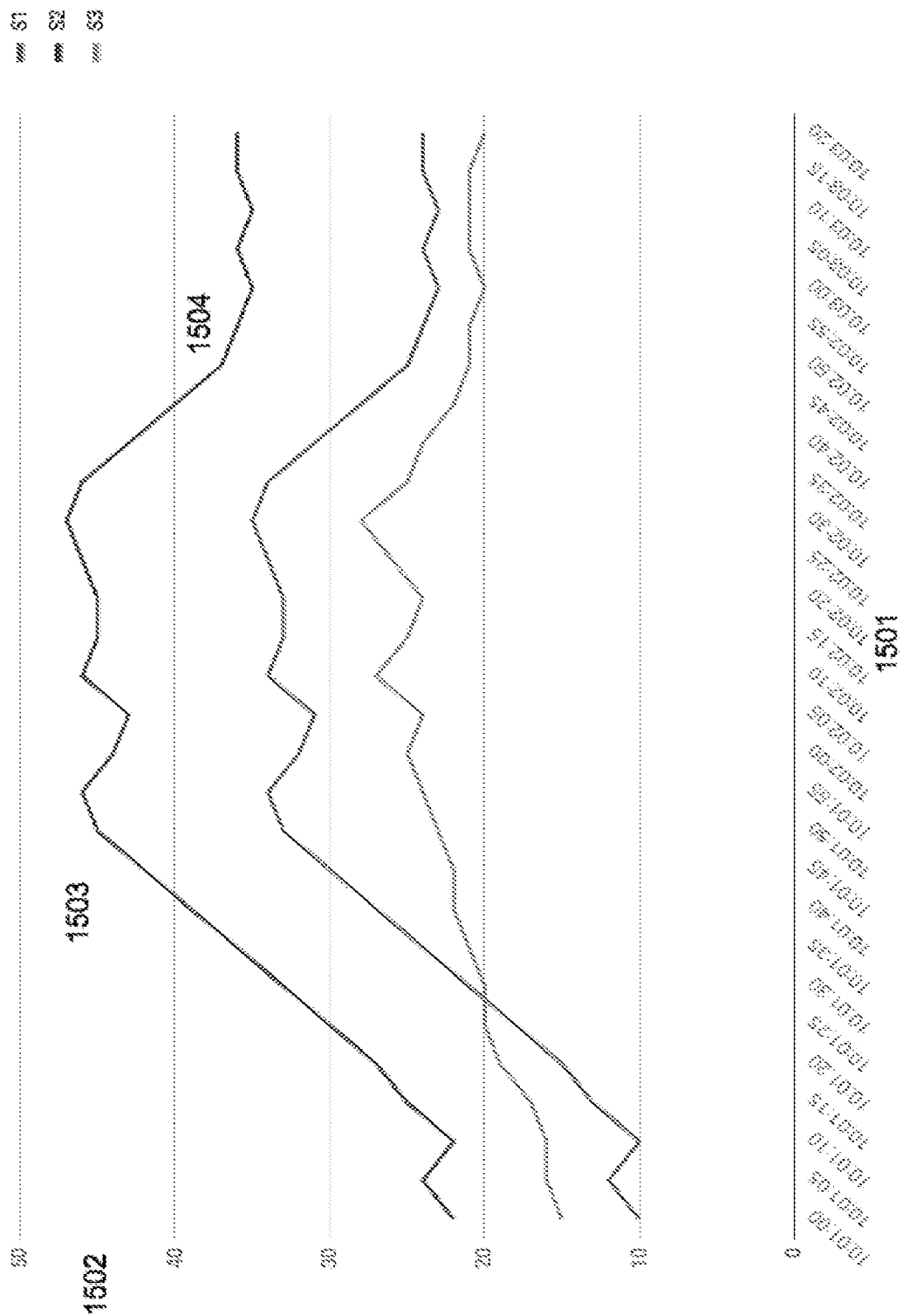
FIG. 15a: is a graph showing the volumes of 3 speakers changing over time in response to the RMS values of the recorded ambient noise as shown by FIG. 15b.
Figure 15B:
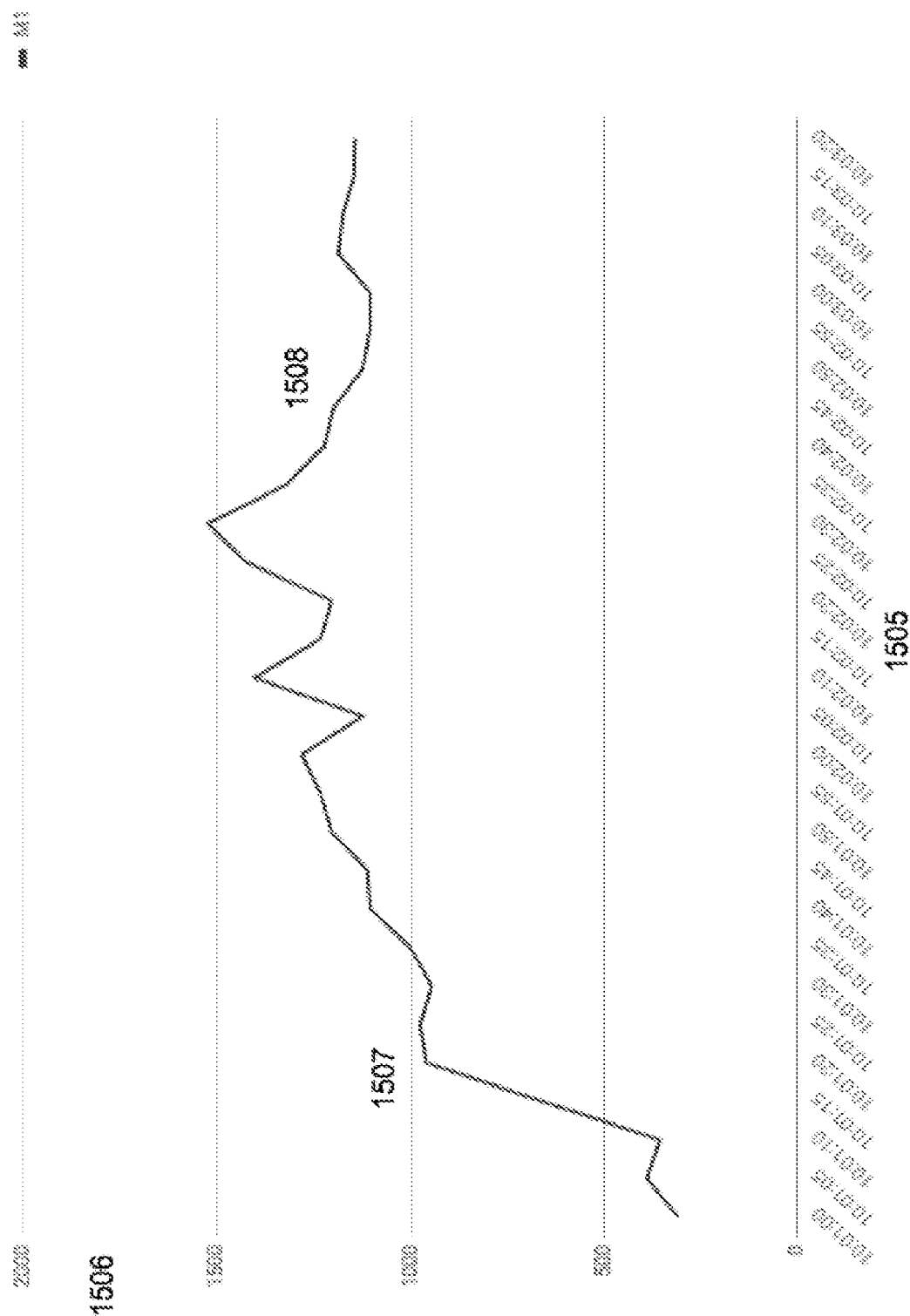
FIG. 15b shows the RMS value passed to each speaker over time.

FIG. 15a and FIG. 15b show 3 speakers S1, S2 & S3 adjusting their volumes 1502 over time 1501. As seen in FIG. 15b a new RMS value 1506 is recorded and sent to each speaker S1, S2 & S3, which adjust their volumes accordingly. FIG. 15b shows the RMS value passed to each speaker over time 1505. FIG. 15b shows the ambient noise getting louder over time 1507 and then leveling out towards the end of the time period 1508. In response to this FIG. 15a shows each speaker reacting to this change in ambience by raising its volume 1503 and decreasing it as the RMS values decrease 1504.

What is claimed is:

1. A computer implemented method for adjusting a sound emitting device to compensate for ambient noise, comprising:
   receiving audio data associated with operation of the sound emitting device at a predetermined location, the audio data relating to both the ambient noise and sound from the sound emitting device;
   processing said audio data to determine an operating characteristic of the sound emitting device;
   comparing the operating characteristic with a predetermined mathematical relationship to determine whether a difference exists with an ideal volume for the sound emitting device;
   identifying an input adjustment to correct the difference; and
   providing the input adjustment to change the operating characteristic of the sound emitting device,
   wherein the predetermined mathematical relationship is a polynomial equation predetermined from a plurality of RMS values and a plurality of sound volume levels, wherein each RMS value of the plurality of RMS values represents an average of the audio data measured at different sound volume levels of the plurality of sound volume levels in respect of the sound emitting device.

2. The method according to claim 1, further comprising receiving data associated with operation of a sound capturing device at a predetermined location.

3. The method according to claim 1, wherein operation of the sound emitting device is at a predetermined location and time.

4. The method according to claim 1, wherein an output variable is a sound volume.

5. The method according to claim 1, wherein the mathematical relationship is determined at the same predetermined location.

6. The method according to claim 1, wherein data is received via a physical connection or received wirelessly, and by one or more of WiFi, Bluetooth, ZigBee, and LiFi.

7. The method according to claim 1, wherein the audio data comprises one or more of voltage, current, power, electrical frequency, electrical amplitude, sound pressure, sound frequency, sound amplitude, and sound volume.

8. The method according to claim 1, wherein the processing step comprises determining a first operating characteristic of that device for that location and determining a second operating characteristic of that device for that location.

9. The method according to claim 1, wherein the predetermined mathematical relationship is determined by a method comprising one or more of:

generating a curve of best fit based on a set of inputs and outputs in respect of the sound emitting device; or algorithmically creating an equation to describe the relationship between a set of inputs and output in respect of the sound emitting device.

10. The method according to claim 1, wherein an entirety of said audio data is received at a single location.

11. The method according to claim 1, wherein an entirety of said audio data is received by one sensor type.

12. A method of managing an audio device, comprising:
detecting an audio device;
identifying audio data associated with the audio device;
retrieving configuration data associated with the identified audio device; and
processing the audio data based at least in part on the configuration data and to send instruction, wherein the processing comprises a predetermined mathematical relationship, wherein the predetermined mathematical relationship is a polynomial equation predetermined from a plurality of RMS values and a plurality of sound volume levels, wherein each RMS value of the plurality of RMS values represents an average of a loudness or power value measured at different sound volume levels of the plurality of sound volume levels in respect of the audio device and send the instruction to the audio device.

13. The method according to claim 12, further comprising:
detecting an audio input device;
identifying audio data associated with the audio input device;
retrieving configuration data associated with the identified audio input device;
detecting a sound emitting device;
identifying data associated with the sound emitting device; and
retrieving configuration data associated with the identified sound emitting device.

14. The method according to claim 12, wherein the audio device is a microphone, and further comprising:
searching a network for a sound emitting device;
determining whether the sound emitting device has previously been configured; and
retrieving configuration data related to the sound emitting device.

15. The method according to claim 12, wherein detecting the audio device comprises one or more of:
receiving a signal from the audio device;
sending a signal on a network to request a response from an audio device wherein the response is only requested of unregistered devices;
polling for unregistered devices;
using an introduction protocol; and
sending a signal via peripheral to request a response from a computer's process wherein the response is only requested of unregistered devices.

16. The method according to claim 12, wherein the data associated with the audio device comprises one or more of: an identification tag or code or number, specification data, manufacturer data, audio device capabilities, device physical attributes, network configuration settings, one or more operational attributes which are selected from current temperature, geographical location, Application Programming Interface, generic interface/gateway information, and pre-configured identity data.

17. The method according to claim 12, wherein the configuration data is retrieved from a data store located locally or remotely.

18. A system for managing a sound emitting device, comprising:
a sound emitting device;
an audio input device; and
a computing device in communication with said sound emitting device and with said audio input device;
wherein said computing device is adapted to process audio data received from the audio input device and communicate one or more instructions to the sound emitting device based on the processing, wherein the processing comprises a predetermined mathematical relationship, wherein the predetermined mathematical relationship is a polynomial equation predetermined from a plurality of RMS values and a plurality of sound volume levels, wherein each RMS value of the plurality of RMS values represents an average of a loudness or power value measured at different sound volume levels of the plurality of sound volume levels in respect of the sound emitting device.

19. The system according to claim 18, wherein communication with the computing device comprises communication over one or more of a wireless network, a telecommunications network, and the internet.

20. The system according to claim 18, further comprising a second computing device configured to respond to queries from the computing device in relation to attributes of one or more of the sound emitting device and the audio input device.

* * * * *

UNITED STATES PATENT AND TRADEMARK OFFICE
CERTIFICATE OF CORRECTION

Page 1 of 2

PATENT NO. : 11,743,664 B2
APPLICATION NO. : 17/807682
DATED : August 29, 2023
INVENTOR(S) : Matthew Elsley et al.

It is certified that error appears in the above-identified patent and that said Letters Patent is hereby corrected as shown below:

On the Title Page

Item (12), should read: Elsley et al.

Item (72), Column 1, Line 1, under Inventors, delete "Matthew Eisley," and insert --Matthew Elsley,--.

In the Drawings

On Sheet 13 of 17, Line 1, Reference Number 1205, Figure 12, delete "recoding" and insert --recording--.

On Sheet 13 of 17, Line 2, Reference Number 1213, Figure 12, delete "adverting" and insert --advertising--.

On Sheet 14 of 17, Line 1, Reference Number 1305, Figure 13, delete "recoding" and insert --recording--.

On Sheet 14 of 17, Line 2, Reference Number 1313, Figure 13, delete "adverting" and insert --advertising--.

In the Specification

In Column 4, Line 36, delete "and or" and insert --and/or--.

In Column 8, Line 52, delete "and or" and insert --and/or--.

In Column 10, Line 17, delete "level." and insert --level,--.

Signed and Sealed this
Twelfth Day of November, 2024

Katherine Kelly Vidal
*Director of the United States Patent and Trademark Office*

In Column 10, Line 57, delete "the a" and insert --the--.

In Column 11, Line 6, delete "Fitting Polynomial" and insert --fitting polynomial--.

In Column 11, Line 51, delete "p[1]" and insert --p[0]--.

In Column 14, Line 6, delete "1)," and insert --10),--.

In Column 16, Lines 46-47, delete "would return would return" and insert --would return--.